United States Patent
Inoue

(10) Patent No.: US 8,245,179 B2
(45) Date of Patent: Aug. 14, 2012

(54) RF CIRCUIT, CIRCUIT EVALUATION METHOD, ALGORITHM AND RECORDING MEDIUM

(75) Inventor: Takashi Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 420 days.

(21) Appl. No.: 12/312,551

(22) PCT Filed: Oct. 3, 2007

(86) PCT No.: PCT/JP2007/069394
§ 371 (c)(1),
(2), (4) Date: May 15, 2009

(87) PCT Pub. No.: WO2008/062607
PCT Pub. Date: May 29, 2008

(65) Prior Publication Data
US 2010/0064265 A1     Mar. 11, 2010

(30) Foreign Application Priority Data

Nov. 21, 2006   (JP) .................................. 2006-314700

(51) Int. Cl.
*G06F 17/50* (2006.01)
(52) U.S. Cl. ........... 716/136; 716/101; 716/126; 703/14
(58) Field of Classification Search .................. 716/101, 716/126, 136
See application file for complete search history.

(56) References Cited

U.S. PATENT DOCUMENTS

| | | | |
|---|---|---|---|
| 5,654,679 A * | 8/1997 | Mavretic et al. | 333/17.3 |
| 5,726,613 A | 3/1998 | Hayashi et al. | |
| 6,571,372 B2 | 5/2003 | Harada | |

FOREIGN PATENT DOCUMENTS

| | | |
|---|---|---|
| JP | 8-274584 | 10/1996 |
| JP | 08-274584 A | 10/1996 |
| JP | 2000-114507 | 4/2000 |
| JP | 2000-114507 A | 4/2000 |
| JP | 2001-177580 | 6/2001 |
| JP | 2001-177580 A | 6/2001 |
| JP | 2002-169851 A | 6/2002 |

OTHER PUBLICATIONS

K. Wang et al., "The S-Probe a New, Cost-Effective, 4-Gamma Method for Evaluating Multi-Stage Amplifier Stability", 1992 MTT-S Digest, pp. 829-832.
Notification of Reasons for Rejection dated Jan. 24, 2012 (with a partial English translation).
Wang, K. et al. The S-probe-a new, cost-effective, 4-gamma method for evaluating multi-stage amplifier stability, Microwave Symposium Digest, 1992, IEEE MTT-S International, United States, IEEE, Jun. 1, 1992, vol. 2, pp. 829-832. ISSN: 0149-645X.

* cited by examiner

*Primary Examiner* — Thuan Do
(74) *Attorney, Agent, or Firm* — McGinn IP Law Group, PLLC

(57) ABSTRACT

It is required to qualitatively design a circuitry device in which not only in a small-signal simulation but also in a large-signal simulation, loop oscillation and motorboating oscillation of an amplifier are precisely predicted to suppress oscillation without severing a loop or without inserting a circulator. To remove insertion loss due to a probe resistor Rx, a negative resistor –Rx/2 is arranged at both ends thereof. To prevent consumption of a DC bias in the probe, a DC block is applied. Further, to remove thermal noise caused by an actual resistor to reduce influence on a noise factor NF, the noise temperature (environmental temperature) of the actual resistor is set to zero Kelvin.

10 Claims, 36 Drawing Sheets

F I G. 2

TYPICAL PARAMETERS
M=1
Rs=10MΩ
Rx=1Ω
α=1/2

$Y[1,1]=-1/\alpha\, Rx \quad Y[1,2]=1/\alpha\, Rx$
$Y[2,1]=1/\alpha\, Rx \quad Y[2,2]=-1/\alpha\, Rx$ F I G. 5
(a)
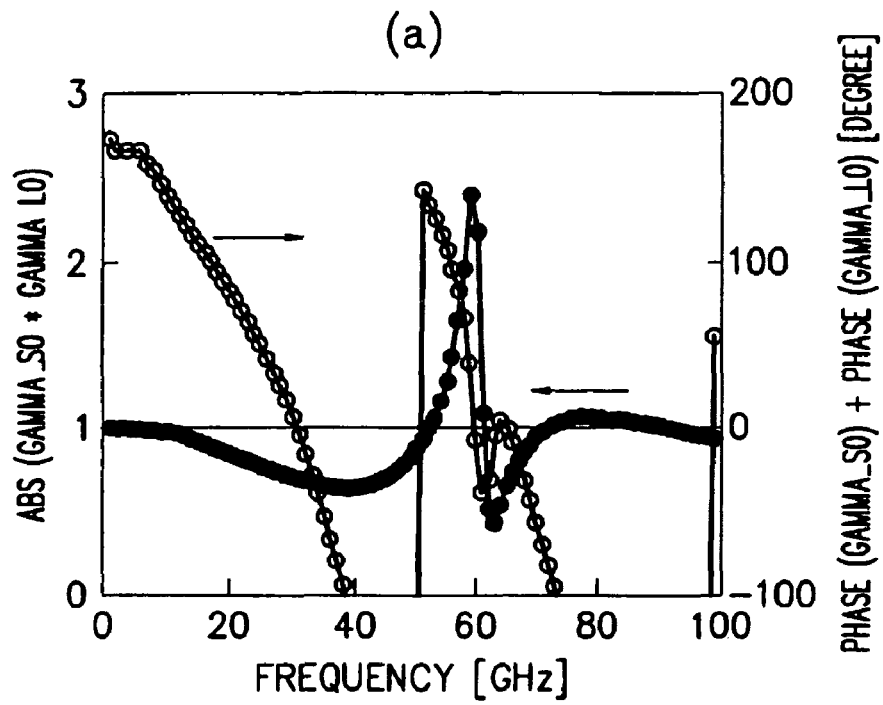
(b)
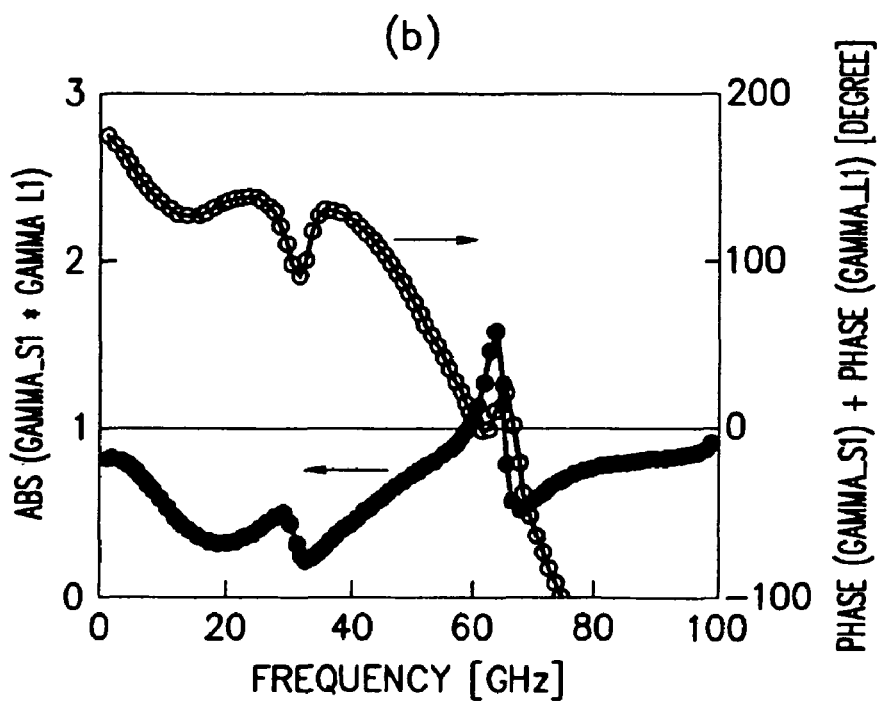

F I G. 7
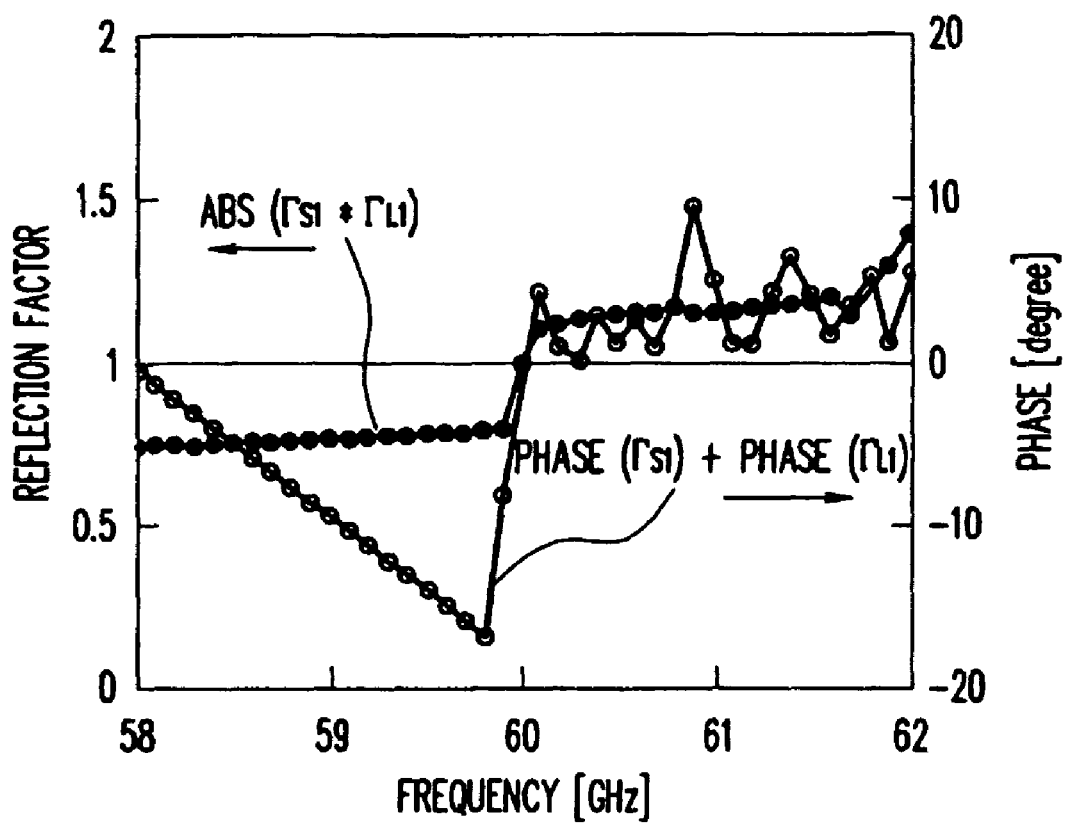

F I G. 8
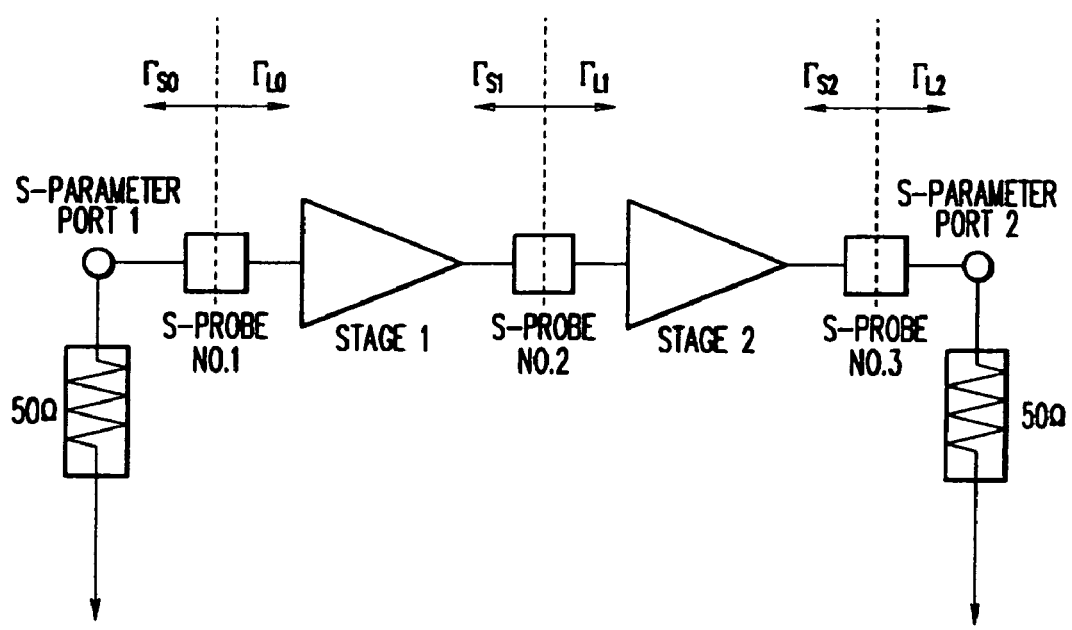

F I G. 10
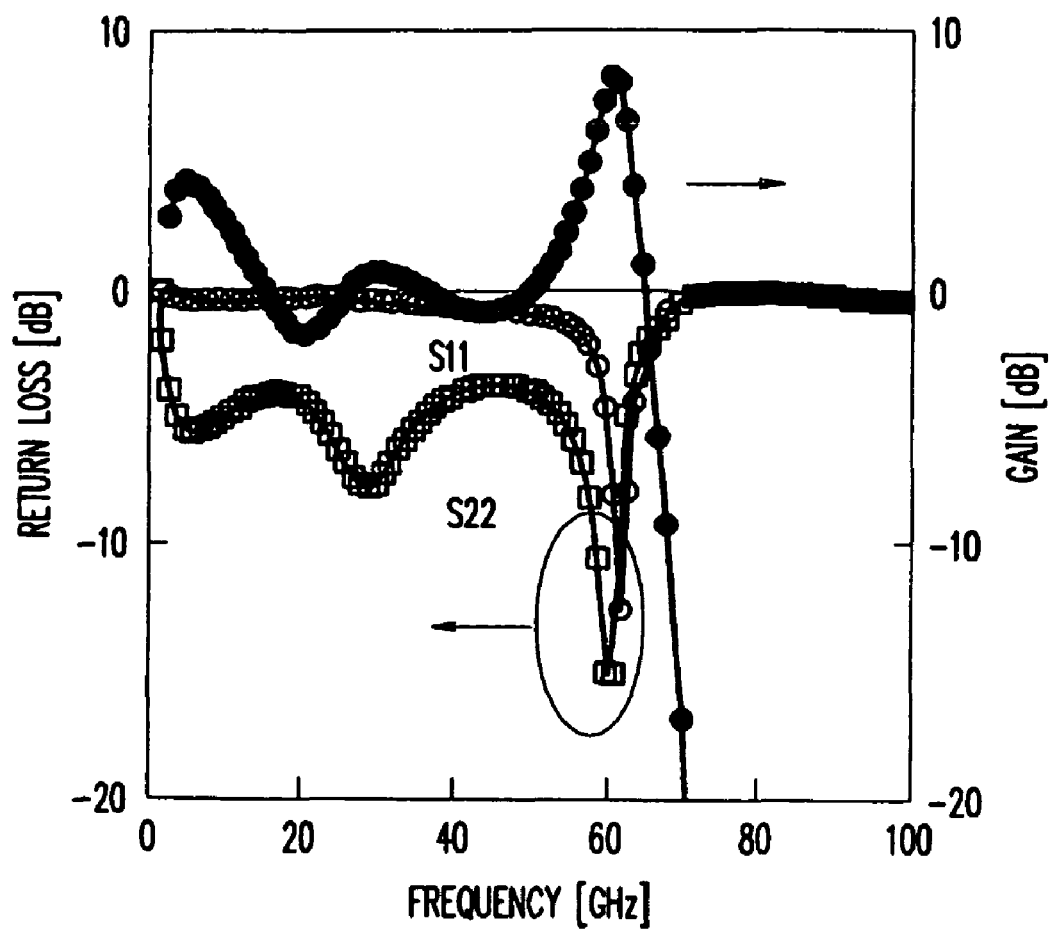

F I G. 14
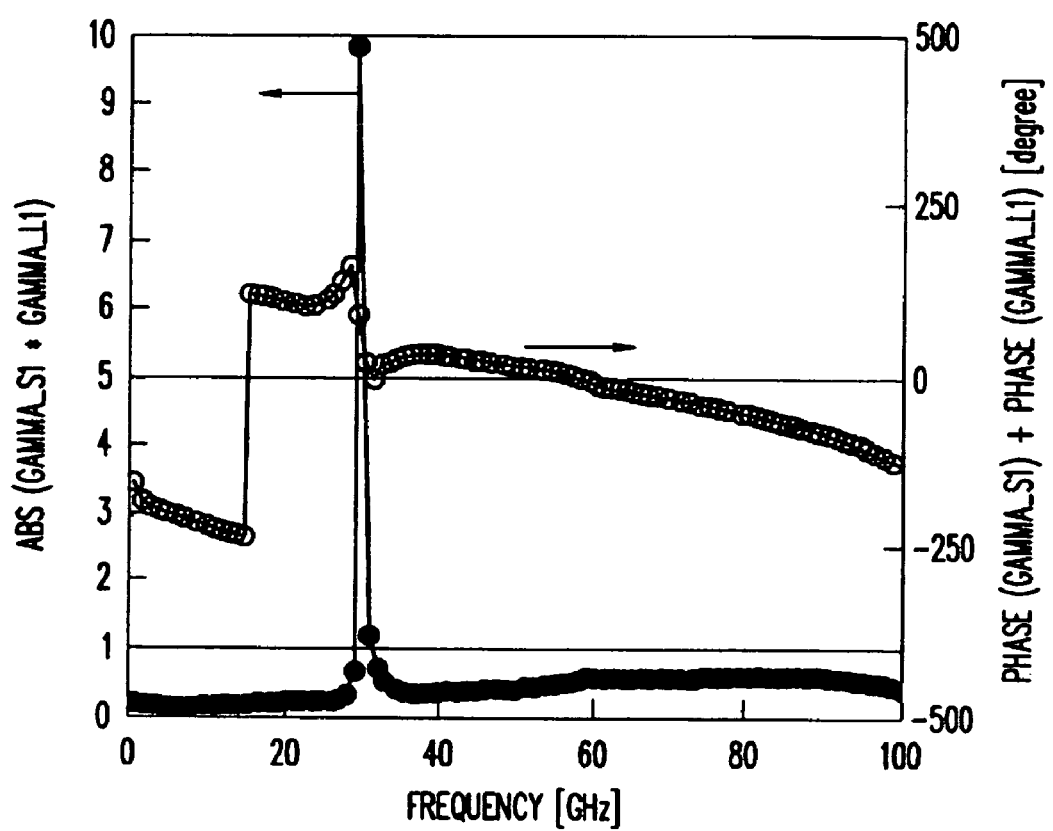

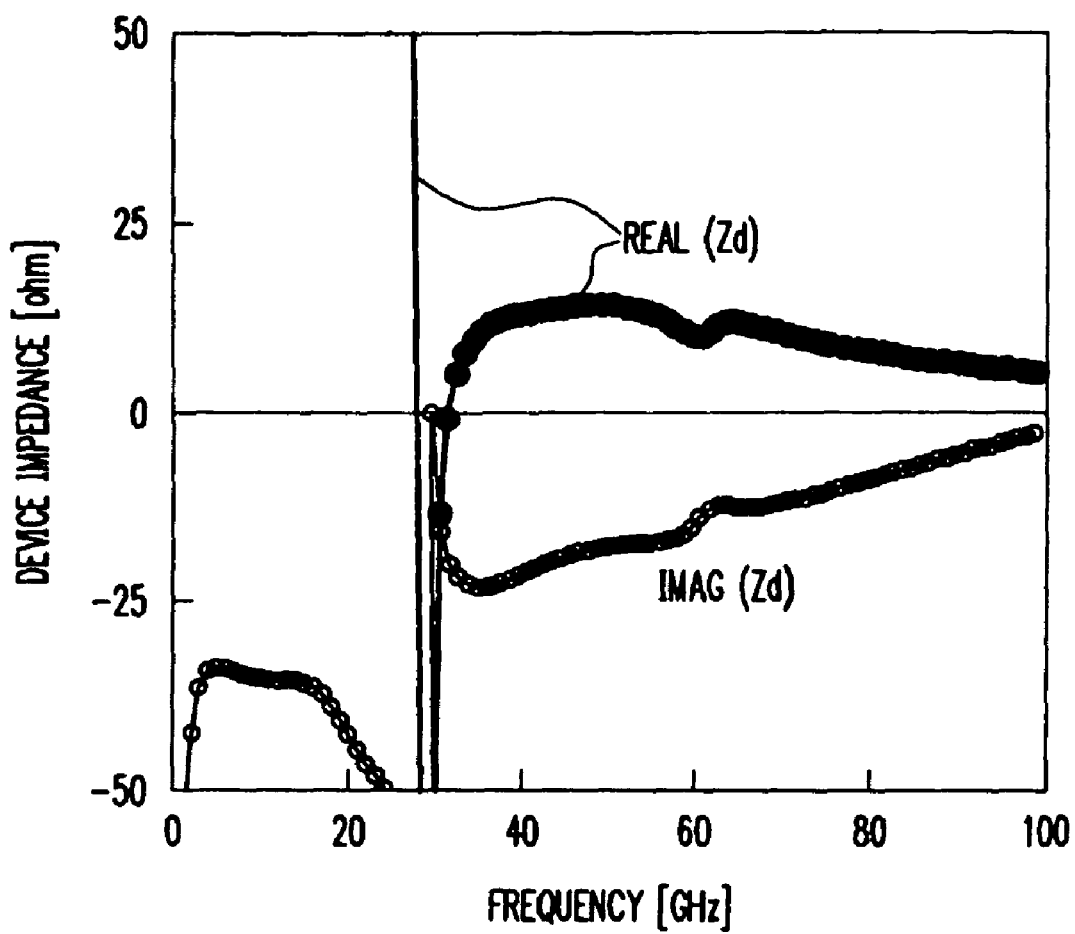
F I G. 15

F I G. 16
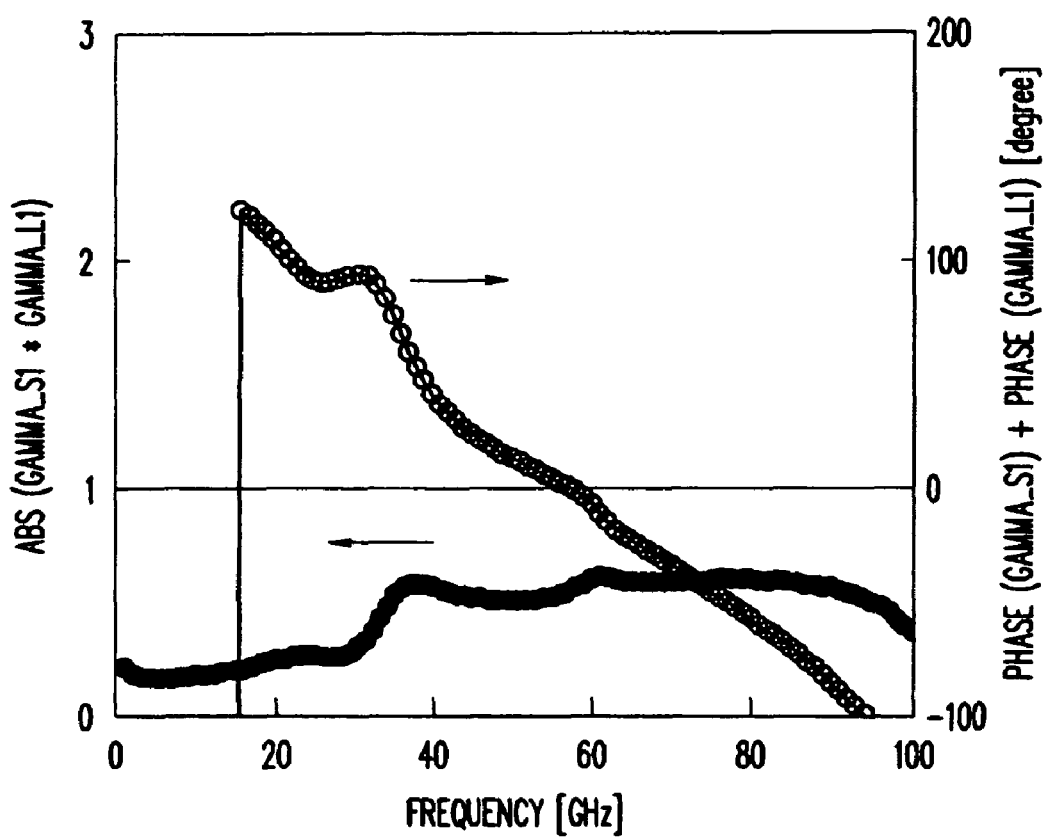

F I G. 17
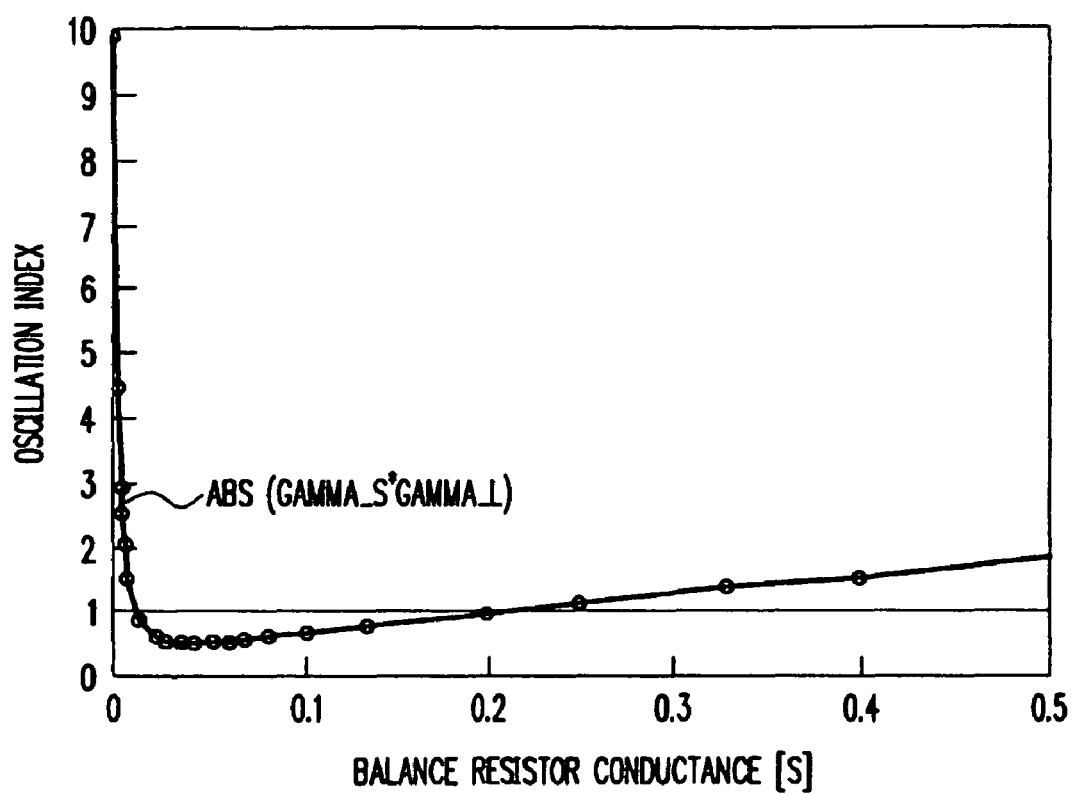

F I G. 18
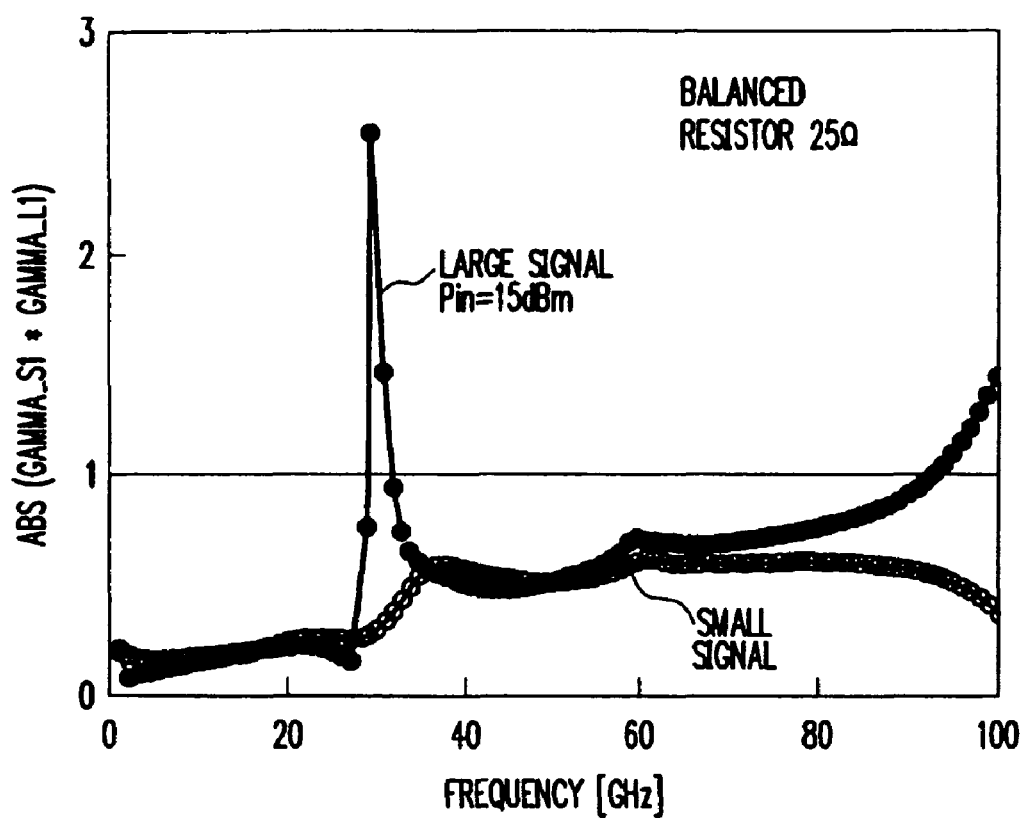

F I G. 22
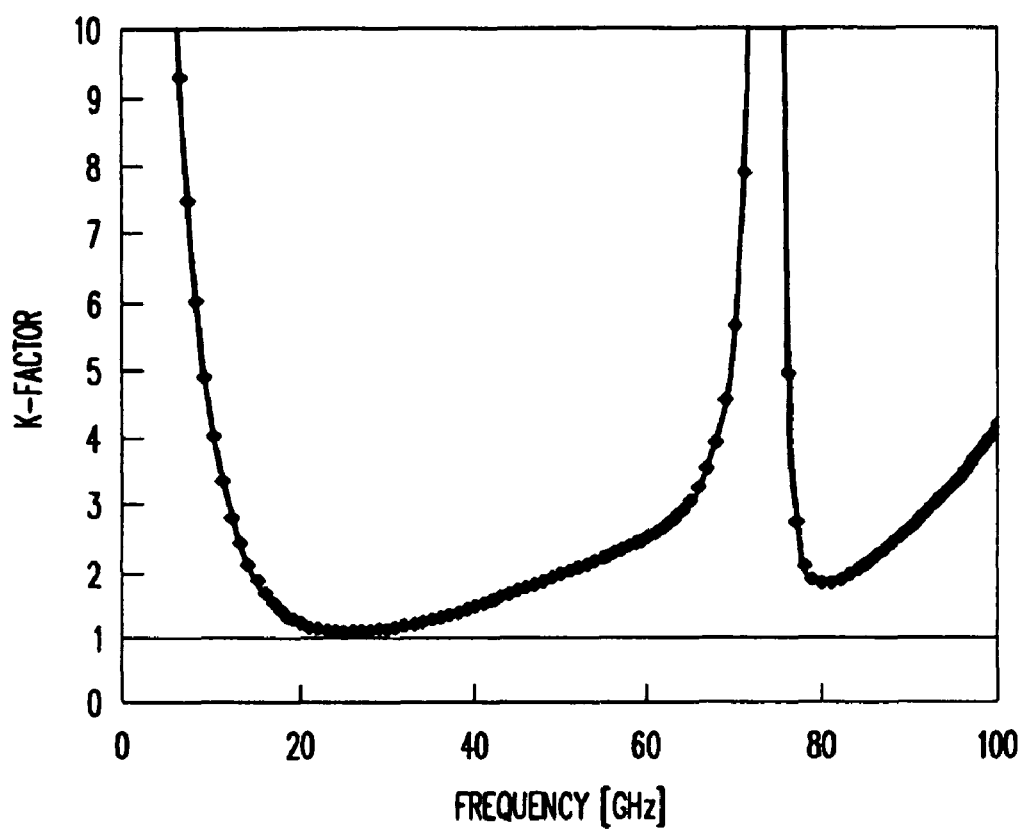

F I G. 25
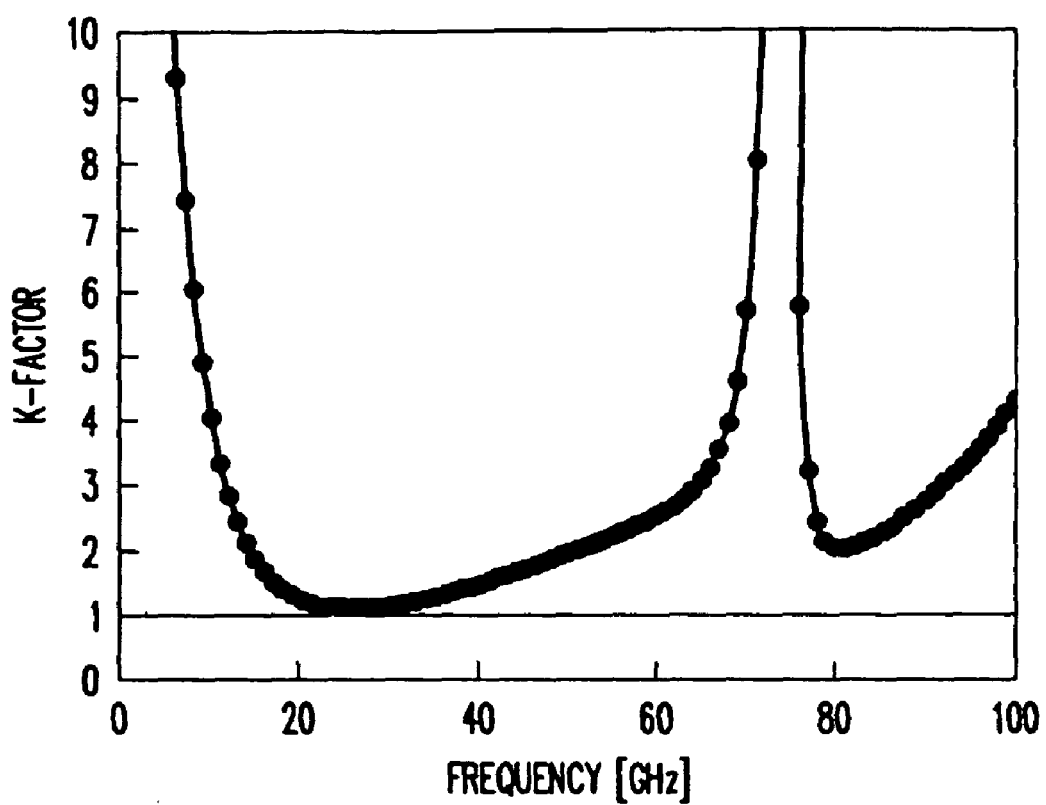

F I G. 28
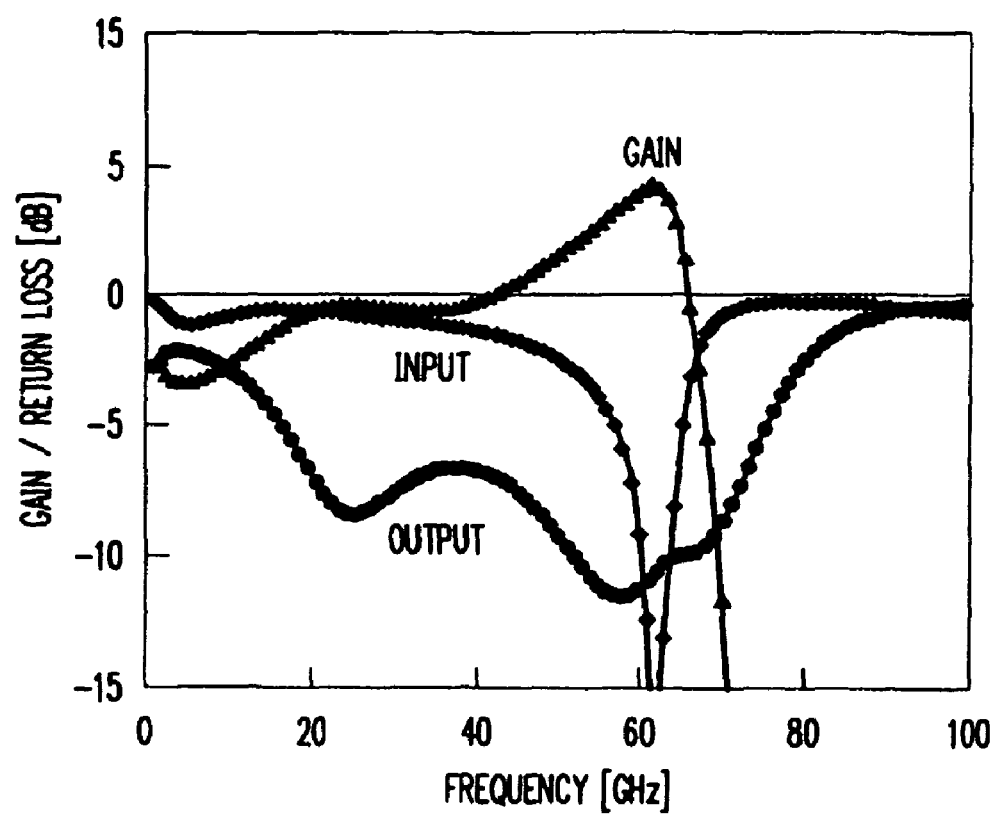

F I G. 32
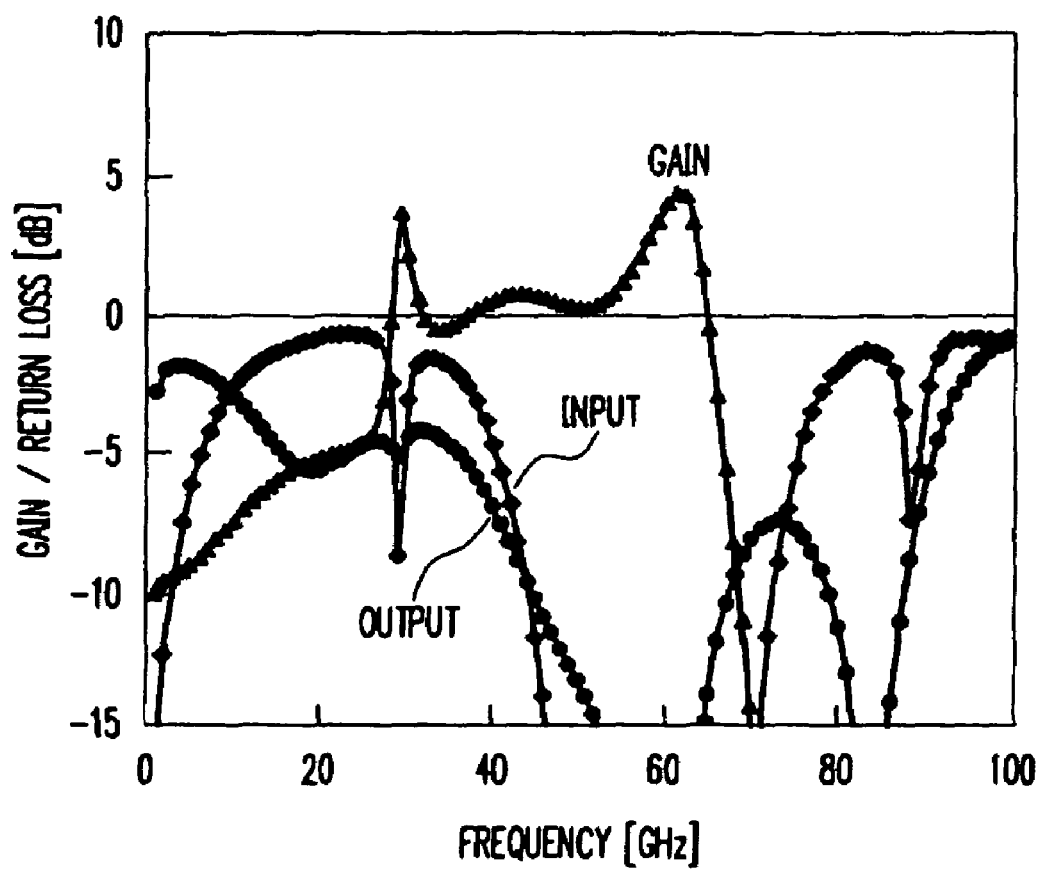

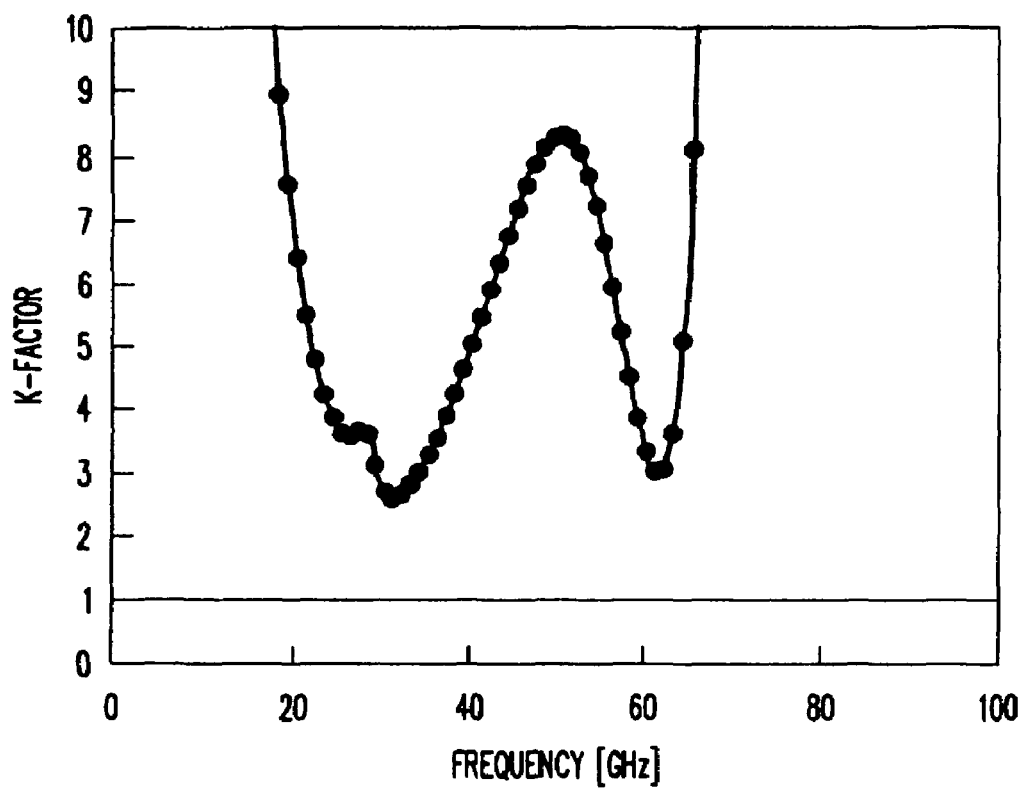
F I G. 33

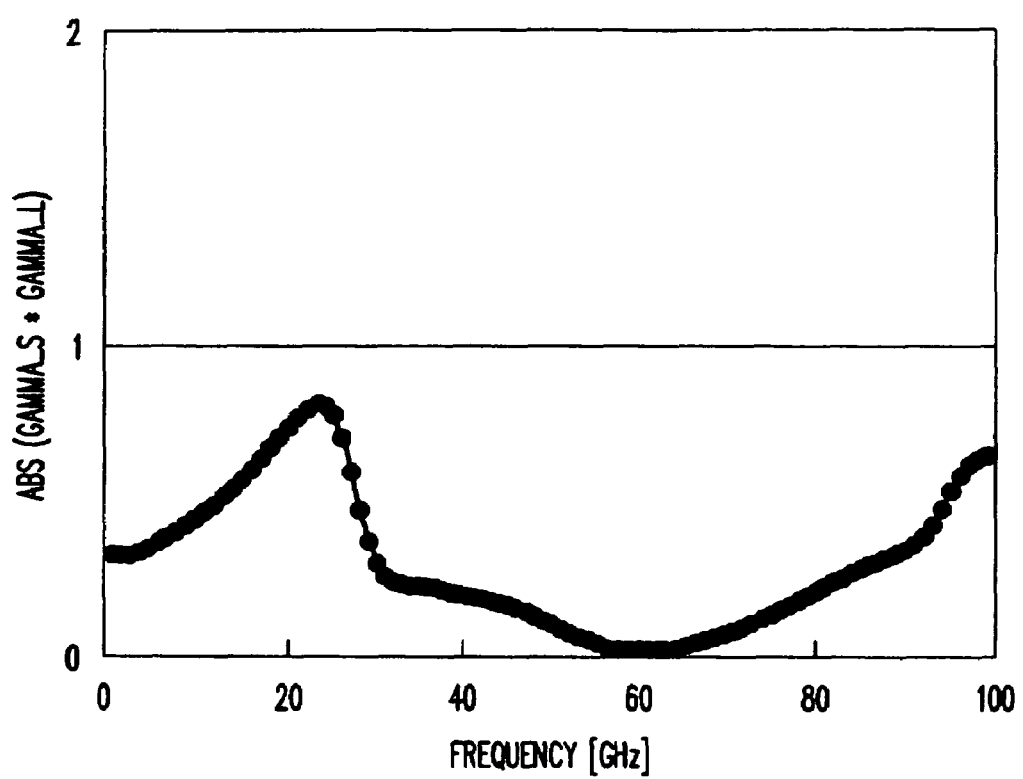
F I G. 38

RF CIRCUIT, CIRCUIT EVALUATION METHOD, ALGORITHM AND RECORDING MEDIUM

TECHNICAL FIELD

The present invention relates to a technique for evaluating electric circuits such as an amplifier circuit and an oscillator circuit.

RELATED ART

To detect parasitic oscillation of an oscillator and an amplifier on a microwave circuit simulator, it is required at an arbitrary point of a circuit to attain reflection coefficients (characteristic impedances) in consideration of a left-side section of the circuit and a right-side section thereof. However, if the circuit is separated at the point, the characteristic of the circuit differs from the inherent characteristic thereof. Accordingly, a method has been devised in which a tool is inserted in an arbitrary position of a circuit without giving much influence upon the characteristic of the circuit to obtain reflection coefficients (impedances) at the point in consideration of a left-side section of the circuit and a right-side section thereof. Representative tools are the S-probe by Wang et al and the S-parameter Oscillator Test Component (equivalent to the S-probe in its actual circuit configuration) mounted as a standard item on the microwave circuit CAD software ADS of Agilent Technology ([1] K. Wang et al., "The S-Probe A New, Cost-Effective, 4-Gamma Method for Evaluating Multi-Stage Amplifier Stability", 1992 MTT-S Digest, pp. 829-832).

The S-probe is, as FIG. 1 shows, a 6-port circuit including large resistors (Rs,Rv) and voltage-dependent power sources $M_3$ and $M_4$ and is inserted, by use of ports 1 and 2, in an arbitrary cross section of a circuit to be observed. Assume here that the ports 1 and 2 are connected respectively to $Z_1$ and $Z_2$ impedances. These impedances can be rendered from the passing characteristics from ports 5 and 6 to ports 3 and 4.

Since the resistors Rs and Rv have quite a high resistance value, little current flows through the ports 6, 5, 4, and 3, which hardly affects the circuit $Z_1$ and $Z_2$. Also, Rx connecting $Z_1$ and $Z_2$ in series to each other has quite a small value to lower insertion loss as much as possible.

Assuming that current $I_2$ flows through the circuit $Z_2$ when voltage $V_6$ is applied to the port 6, voltages Va and Vb at nodes A and B at both ends of resistor Rx are $$Va = Vb + I_2 \cdot Rx = Vb(Z_2 + Rx)/Z_2$$

$$Vb = I_2 \cdot Z_2.$$

Additionally, voltage $V_3$ at the port 3 and voltage $V_4$ at the port 4 are $$V_3 = -M_3 \cdot Vr = -M_3(Va - Vb) = -VaM_3Rx/(Z_2 + Rx)$$

$$V_4 = -M_4 \cdot Vb.$$

Therefore, the passing characteristics from the port 6 to the ports 3 and 4 are $$S_{36} = V_3/V_6 = -VaM_3Rx/[V_6(Z_2 + Rx)]$$

$$S_{46} = V_4/V_6 = -M_4Z_2Va/[V_6(Z_2 + Rx)].$$

Similarly, assuming that current $I_1$ flows through the circuit $Z_1$ when voltage $V_5$ is applied to the port 5, voltages Va and Vb at the nodes A and B at both ends of resistor Rx are $$Va = I_1 Z_1$$

$$Vb = Va + I_1 Rx = Va(Z_1 + Rx)/Z_1.$$

In addition, the voltage $V_3$ at the port 3 and the voltage $V_4$ at the port 4 are $$V_3 = -M_3 Vr = -M_3(Vb - Va) = VaM_3Rx/(Z_1 + Rx)$$

$$V_4 = -M_4 Vb.$$

Hence, the passing characteristics from the port 5 to the ports 3 and 4 are $$S_{35} = V_3/V_5 = -VbM_3Rx/[V_5(Z_1 + Rx)]$$

$$S_{45} = V_4/V_5 = M_4 Vb/V_5.$$

In consequence, $$S_{46}/S_{36} = M_4 Z_2/M_3 Rx$$

$$S_{45}/S_{35} = -M_4(Z_1 + Rx)/(M_3 Rx).$$

In the expression, $$M_4/(M_3 Rx) = 1$$

$$0 < R << 1.$$

Particularly, by selecting as specific circuit parameters $$Rs = 10 \text{ M}\Omega$$

$$Rv = 10 \text{ M}\Omega$$

$$Rx = 100 \mu\Omega$$

$$M_3 = 1000$$

$$M_4 = 1,$$

there are obtained $$Z_1 = -S_{45}/S_{35}$$

$$Z_2 = S_{46}/S_{36}.$$

Therefore, the $Z_1$ and $Z_2$ impedances are rendered from the passing characteristics from the ports 5 and 6 to the ports 3 and 4. Hence, by viewing the circuit side, forward and backward reflection coefficients $\Gamma_S$ and $\Gamma_L$ are obtained respectively as $$\Gamma_S = (Z_1 - Z_0)/(Z_1 + Z_0)$$

$$\Gamma_L = (Z_2 - Z_0)/(Z_2 + Z_0).$$

Here, $Z_0$ is system impedance and inner resistance of the S parameter probe and is ordinarily 50 Ω.

Incidentally, there has been proposed a technique in which a capsulated document is capsulated as a single document which includes content information, an operation program to make a computer implement various functions, and transmission destination information to send various information pieces to the computer; and by restricting operation processing to the content information in the capsulated document, it is possible to prevent unlawful use of the content information in the capsulated document and to protect the copyright of the content information (reference is to be made to, for example, Patent Document 1). Patent Document 1: Japanese Patent Laid-Open Publication No. 2001-177580

DISCLOSURE OF THE INVENTION

Problem to be Solved by the Invention

It cannot be considered that the relevant probe circuit which is inserted in an arbitrary section of a circuit on a microwave circuit simulator to obtain reflection coefficients in the section does not affect the circuit to be observed at all; however, the more the probe resistance Rx which affects the circuit to be observed is, the more loss in the circuit appears. Hence, it is required that Rx is sufficiently small, e.g., 100µΩ.

If the value of the probe resistance Rx is sufficiently small, e.g., 100 µΩ as the typical value described above, the actual insertion loss can be substantially ignored. Particularly, when a small signal is employed on the circuit simulator, the reflection coefficients (i.e., characteristic impedances) are determined by the circuit topology in the actual calculation, and the process to calculate the potential difference between both ends of the probe resistor is not adopted; hence, even if the probe resistance is quite small, there does not occur any problem in the numerical precision of the potential difference between both ends in the numeric calculation. Therefore, in a case wherein the reflection coefficients of a small signal of the circuit are obtained by the relevant S-probe, the S-probe can almost correctly calculate the reflection coefficients.

However, in a case wherein the reflection coefficients of the circuit are obtained by the S-probe through a large-signal simulation, the reflection coefficients are calculated in an actual calculation based on an input signal to the circuit and a response thereto. Here, since the resistor Rx is employed as a voltage probe, if it is desired to lower the resistance value Rx to reduce the influence on the circuit, there takes place canceling of positions in the potential difference appearing on both ends of the resistor; there hence exists a problem that the resistance value Rx cannot be extremely reduced.

Furthermore, the resistance Rx employed as a voltage probe is set, to lower the insertion loss, to a value remarkably smaller than the ordinary resistance component; hence, to obtain a probe voltage for high-precision observation, it is inevitable to input a relatively large probe signal; this causes perturbation in the circuit to be observed and leads to a situation wherein the reflection coefficients cannot be correctly obtained in the circuit.

However, it needs not to say that there occurs a dilemma in which the insertion loss becomes larger if Rx is increased.

Moreover, there also exists a drawback in which the DC bias is not appropriately applied to the circuit to be observed, in the form that the bias passes through the probe.

The present invention has been devised to remove the problems described above. An exemplary object thereof is to provide an RF circuit, a circuit evaluation method, an algorithm, and a recording medium in which not only in a small-signal simulation but also in a large-signal simulation, loop oscillation and motorboating oscillation of an amplifier can be precisely predicted to quantitatively design a circuitry device to suppress oscillation without severing a loop or without inserting a circulator.

Means for Solving the Problem

To achieve the exemplary object, the present invention has features as follows.

A reflection coefficient measuring circuit (to be referred to as "no-loss S-probe" hereinbelow) proposed here is obtained by improving the S-probe by Wang et al; and by canceling the positive resistance component Rx by use of negative resistance, the probe is strictly a no-loss probe in circuit operation. Since the probe is a no-loss probe, it is not required to apply an extremely small value to the value of the probe resistance Rx. Therefore, to obtain reflection coefficients of a circuit in a large-signal state, the problem of the canceling of the potential difference at both ends of the probe resistor is removed; it is hence possible to obtain a probe voltage at high precision.

That is, the reflection coefficient calculation method employing the no-loss S-probe is capable of attaining reflection coefficients using an input of a sufficiently small probe signal which hardly causes perturbation in the circuit; it is also possible in a large-signal state and at an arbitrary point of the circuit to obtain coefficients (characteristic impedances) in consideration of a left-side section of the circuit and a right-side section thereof quite appropriately when compared with the relevant method.

A first exemplary aspect of the present invention is an RF circuit on an actual circuit or a circuit simulator, including a function for being inserted by a first port and a second port thereof in a circuit to be observed, at an arbitrary cross-sectional point of the circuit, and evaluating a reflection coefficient or a characteristic impedance in the cross section, insertion loss between the first port and the second port strictly being completely zero.

A second exemplary aspect of the present invention is a circuit on an actual circuit or a circuit simulator to be used in a microwave or millimeter wave range or a high-frequency range, including six RF ports, wherein a first resistor is connected from port 1 to a node a on the circuit, a second resistor is connected from the node a to a node b, a third resistor is connected from the node b to port 2, a fourth resistor is connected from the node a to a node c, a fifth resistor is connected from the node b to a node d, and a sixth resistor is connected from the node b to a node e; a first DC block (or a capacitor which has quite a large capacity value and which passes therethrough an RF signal almost without loss) is connected from the node c to port 6, a second DC block (or a capacitor which has quite a large capacity value and which passes therethrough an RF signal almost without loss) is connected from the node d to port 5, and a third DC block (or a capacitor which has quite a large capacity value and which passes therethrough an RF signal almost without loss) is connected from the node e to a ground point (earth); a first voltage-dependent power source is connected from port 3 to a ground point (earth) and a second voltage-dependent power source is connected from port 4 to a ground point (earth); assuming that an instantaneous potential at the node a measured using as a reference the node b of the second resistor is Vr, there is induced, at the same time of occurrence of Vr, an instantaneous voltage of a magnitude of M·Vr (M is a real coefficient) in a direction from a ground point (earth) to the port 3; and assuming that an instantaneous potential at the node b measured using as a reference the node e of the sixth resistor is Vb, there is induced, at the same time of occurrence of Vb, an instantaneous voltage of a magnitude of Vb in a direction from a ground point (earth) to the port 4; and assuming that Rx is a positive real number, Rs is a positive real number and Rs>>1, and α is a real coefficient, the first and third resistors have resistance values which widely include also negative resistance and which are respectively $-\alpha Rx$ and $(\alpha-1)Rx$, and the second resistor has a resistance value of Rx, and the four, five, and sixth resistors have a resistance value Rs which is quite larger than a system resistance.

Additionally, in consideration of the design and evaluation of a low-noise amplifier, the circuit in accordance with the second exemplary aspect may be a circuit wherein the first to sixth resistors are used at an environmental temperature of absolute zero degree (zero degree Kelvin) or the environmental temperature is set to absolute zero degree (zero degree Kelvin).

Moreover, in relation to the evaluation method regarding stability of a circuit to be observed, by use of the circuit described above, a third exemplary aspect of the present invention is an evaluation method or an algorithm on a circuit simulator, wherein by inserting an RF circuit in accordance with the above exemplary aspects by the first port and the second port in a circuit to be observed, at an arbitrary cross-sectional point of the circuit and evaluating a forward or backward reflection coefficient (characteristic impedance); and by assuming that the forward reflection coefficient is $\Gamma_S$ and the backward reflection coefficient is $\Gamma_L$, an absolute value of a product therebetween abs($\Gamma_S \cdot \Gamma_L$) is or the absolute value of the product and a phase angle of the product phase ($\Gamma_S \cdot \Gamma_L$) are employed as an index of stability of the circuit to be observed.

In addition, a fourth exemplary aspect of the present invention also includes a measuring method and a measuring apparatus for electric circuits such as an amplifier circuit and an oscillator circuit, a designing method and a designing apparatus for the electric circuits, a recording medium having stored therein the measuring method of the electric circuits, and a recording medium having stored therein the designing method of the electric circuits, including the above exemplary aspects.

As FIG. 2 shows, the probe circuit of the present invention is a 6-port circuit including a voltage-dependent power source and resistors having a large resistance value, and the circuit is inserted by use of ports 1 and 2 as circuit insertion terminals in an arbitrary point of a circuit the reflection coefficients of which are to be obtained; referring to FIG. 2, description will be given of perturbation caused in the circuit due to insertion of this probe in the circuit.

The section between the ports 1 and 2 seems to be completely short-circuited (the resistance value is zero) because the resistance Rx is cancelled by –Rx obtained as the sum of the resistor values on both sides thereof, –αRx and (α–1)RX. On the other hand, since the resistor Rs has quite a large value, a current hardly flows through the ports 3, 4, 5, and 6 and hence the circuit impedances $Z_1$ and $Z_2$ are not affected. By use of a DC block, a correct DC bias may also be applied. Further, the resistor Rx to be inserted in series between the circuits $Z_1$ and $Z_2$ has a relatively small value, which is cancelled by the negative resistor –Rx additionally disposed; hence, the insertion loss of this probe can be strictly ignored. Moreover, the resistor Rx operates as a voltage probe, but an extremely small value needs not to be employed for Rx; it is hence possible to prevent the canceling of the potential difference thereat in the numeric calculation. Also, by setting the noise temperature of each actual resistor to absolute zero degree (zero degree Kelvin), the influence exerted by this probe onto the noise factor NF of the circuit is completely zero (required in the design of LNA). Typical circuit parameters will be favorably selected as $Rs = 10$ MΩ

$Rx = 1$ Ω

$M = 1$ $\alpha = \frac{1}{2}$.

Incidentally, assume that the circuits having impedances $Z_1$ and $Z_2$ are connected respectively to the ports 1 and 2. These impedances are derived from the passing characteristics from the ports 5 and 6 to the ports 3 and 4 as $Z_1 = -S[4,5]/S[3,5] - Rx/2$ $Z_2 = S[4,6]/S[3,6] + Rx/2$.

Therefore, viewing the circuit side, the forward and backward reflection coefficients $\Gamma_S$, $\Gamma_L$ are respectively attained as $\Gamma_S = (Z_1 - Z_0)/(Z_1 + Z_0)$ $\Gamma_L = (Z_2 - Z_0)/(Z_2 + Z_0)$.

Here, $Z_0$ is system impedance and internal resistance of the S parameter probe which is ordinarily 50 Ω.

Advantages of the Invention

By use of the S-probe of the present invention, not only in a small-signal simulation but also in a large-signal simulation, loop oscillation and motorboating oscillation of an amplifier can be precisely predicted to quantitatively design a circuitry device to suppress oscillation without severing a loop or without inserting a circulator. Therefore, the no-loss S-probe of the present invention is quite useful for the designing of a microwave circuit.

BEST MODE FOR CARRYING OUT THE INVENTION

Exemplary Embodiment 1

The no-loss S-probe is an ideal probe to be used on a simulator and includes a voltage-dependent power source, capacitors, and resistors, and the probe is capable of obtaining reflection coefficients (forward and backward) at an insertion point with strictly zero insertion loss. The no-loss S-probe has in general a 6-port circuit configuration as shown in FIG. 2 and can be inserted, by use of the ports 1 and 2 as circuit insertion terminals, at an arbitrary point of a circuit the reflection coefficients of which are desired to be obtained.

First, the loss caused in the circuit due to insertion of the probe in the circuit will be discussed. The section from the port 1 to the port 2 seems to be short-circuited because the resistance Rx is cancelled by the negative resistance –Rx. On the other hand, since the resistor Rs has quite a large value, a current hardly flows through the ports 3, 4, 5, and 6 and hence the circuit impedances $Z_1$ and $Z_2$ are not affected.

By using a DC block, a correct DC bias may also be applied. Further, the resistor Rx to be inserted in series between the circuits $Z_1$ and $Z_2$ has a relatively small value, which is cancelled by the sum of resistor components added to both sides thereof, i.e. –Rx (the negative resistor); hence, the insertion loss of this S-probe can be strictly ignored.

In addition, the resistor Rx operates as a voltage probe, but an extremely small value needs not to be employed for Rx due to support of the above negative resistance in this method; hence, it is only required to apply, as the probing signal, a signal of relatively small power which hardly causes perturbation in the circuit in the large-signal analysis, leading to a merit that the reflection coefficients (impedances) are obtainable with almost no perturbation (i.e., correctly) in the large-signal state. Further, by setting the noise temperature of each actual resistor to absolute zero degree (zero Kelvin), the influence exerted by this S-probe onto the noise factor NF of the circuit is completely zero; and when it is applied to a Low-Noise Amplifier (LNA), the NF design can be correctly carried out.

In this regard, assume that the circuits having impedances $Z_1$ and $Z_2$ are connected respectively to the ports 1 and 2. These impedances can be derived from the RF passing characteristics from the ports 5 and 6 to the ports 3 and 4. This will now be proved in a case of a small-signal analysis employing S-parameter ports.

Assuming that current $I_2$ flows through the circuit $Z_2$ when voltage $V_6$ is applied to the port 6, voltages $V_A$ and $V_B$ at nodes A and B at both ends of resistor Rx are $$V_A = V_B + I_2 Rx$$
$$= V_B[Z_2 + Rx + (\alpha - 1)Rx]/[Z_2 + (\alpha - 1)Rx]$$
$$= V_B[Z_2 + \alpha Rx]/[Z_2 + (\alpha - 1)Rx]$$
$$V_B = I_2[Z_2 + (\alpha - 1)Rx/2]$$

Moreover, voltage $V_3$ at the port 3 and voltage $V_4$ at the port 4 are respectively expressed as $$V_3 = MVr$$
$$= M(V_A - V_B)$$
$$= V_A MRx/(Z_2 + Rx + (\alpha - 1)Rx)$$
$$= V_A MRx/(Z_2 + \alpha Rx)$$
$$V_4 = V_B.$$

Hence, the passing characteristics from the port 6 to the ports 3 and 4 are derived as $$S[3,6] = V_3/V_6 = V_A MRx/\{V_6(Z_2 + \alpha Rx)\}$$

$$S[4,6] = V_4/V_6 = [Z_2 + (\alpha-1)Rx]V_A/[VV_6(Z_2 + \alpha Rx)].$$

Through a similar discussion, assuming that current $I_1$ flows through the circuit $Z_1$ when voltage $V_5$ is applied to the port 5, voltages $V_A$ and $V_B$ at the nodes A and B at both ends of resistor Rx are respectively expressed as $$V_A = I_1(Z_1 - \alpha Rx)$$
$$V_B = V_A + I_1 Rx$$
$$= V_A(Z_1 - \alpha Rx + Rx)/(Z_1 - \alpha Rx)$$
$$= V_A[Z_1 + (1 - \alpha)Rx]/(Z_1 - \alpha Rx).$$

Also, the voltage $V_3$ at the port 3 and the voltage $V_4$ at the port 4 are respectively expressed as $$V_3 = MVr$$
$$= M(V_B - V_A)$$
$$= -V_B MRx/(Z_1 - \alpha Rx + Rx)$$
$$= -V_B MRx/[Z_1 + (1 - \alpha)Rx]$$
$$V_4 = V_B.$$

Therefore, the passing characteristics from the port 5 to the ports 3 and 4 are derived as $$S[3,6] = V_3/V_5 = -V_B MRx/[V_5\{Z_1 + (1-\alpha)Rx\}]$$

$$S[4,5] = V_4/V_5 = V_B/V_5.$$

As a result, $$S[4,6]/S[3,6] = [Z_2 + (\alpha-1)Rx]/(MRx)$$

$$S[4,5]/S[3,5] = -[Z_1 + (1-\alpha)Rx]/(MRx).$$

Here, by selecting MRx=1, it is proved that the circuit impedances $Z_1$ and $Z_2$ are obtained as $$Z_1 = -S[4,5]/S[3,5] - (1-\alpha)Rx$$

$$Z_2 = S[4,6]/S[3,6] + (1-\alpha)Rx.$$

As above, it is proved that the circuit impedances $Z_1$ and $Z_2$ are obtained from the passing characteristics from the ports 5 and 6 to the ports 3 and 4. Hence, viewing the circuit side, the forward and backward reflection coefficients $\Gamma_S$ and $\Gamma_L$ are obtained respectively as $$\Gamma_S = (Z_1 - Z_0)/(Z_1 + Z_0)$$

$$\Gamma_L = (Z_2 - Z_0)/(Z_2 + Z_0).$$

Here, $Z_0$ is system impedance and inner resistance of the S parameter probe and is ordinarily 50 Ω.

In the actual calculation for the small-signal analysis on a circuit simulator, the circuit reflection coefficients are calculated directly from circuit topologies; a process to observe an output response in reply to the probe signal input is not employed. However, at large-signal analysis, the process described above is employed; by observing an output response in reply to the probe signal input, the circuit impedances $Z_1$ and $Z_2$ are obtained from the passing characteristics from the ports 5 and 6 to the ports 3 and 4. Assuming that when a voltage V6 is applied to the port 6, voltages V36 and V45 appear respectively at the ports 3 and 4, and when a voltage V5 is applied to the port 5, voltages V35 and V36 appear respectively at the ports 3 and 4, the circuit impedances $Z_1$ and $Z_2$ are represented as $$Z_1 = -V45/V_{35} - (1-\alpha)Rx$$

$$Z_2 = V46/V36 + (1-\alpha)Rx.$$

Typical values of the resistors Rs and Rx and the parameter M of the power source to be actually employed are favorably set, for example, as Rs=10 MΩ

Rx=1 Ω

M=1

α=½.

FIG. 3 shows the no-loss S-probe when these typical circuit parameters are employed in the configuration.

In this connection, there also exists a circuit simulator in which a resistance value having a minus value (i.e., a negative resistance value) cannot be employed as the input circuit parameter. In such case, to obtain a general resistance −αRx which is expanded to include a negative resistance value in general, it is only required to set, in a 4-parameter admittance matrix element {Y} shown on the right side of FIG. 2, as $Y[1,1] = -1/\alpha Rx$, $Y[1,2] = 1/\alpha Rx$ $Y[2,1] = 1/\alpha Rx$, $Y[2,2] = -1/\alpha Rx$;

to obtain, for example, the negative resistance −Rx/2, it is only necessary to set $Y[1,2] = -2/Rx$, $Y[1,2] = 2/Rx$ $Y[2,1] = 2/Rx$, $Y[2,2] = -2/Rx$ as shown on the right side of FIG. 3.

The S-probe is a 6-port circuit; hence, in the procedure for the circuit oscillation analysis and design, when n S-probes are used, there is conducted multi-port analysis for about 6n ports; and in the large-signal analysis, a two-tone harmonic balance analysis is required; hence the analysis becomes considerably complex.

Exemplary Embodiment 2

Description will now be given of an example in which the method of the no-loss S-probe is applied to an oscillator circuit design as the basis of the microwave circuit oscillation analysis and design. FIG. 4 is a basic circuit layout diagram of an oscillator to be described here. An FET is used as an active element and a series feedback form in which a source terminal has a stub is employed in the circuit configuration. As shown in the diagram, the S-probe is inserted in the gate terminal and the drain terminal of the oscillator to obtain the reflection coefficients toward the left and the right of the circuit therefrom. In the circuit configuration of this type, since an oscillation signal is ordinarily outputted from the drain side and the load is coupled with the drain side, the oscillation condition is judged by the reflection coefficient (characteristic impedance) at the drain terminal.

Assume that when viewing the active element side and the load side, the reflection coefficients are respectively $\Gamma_{S1}$ and $\Gamma_{L1}$, as shown in FIG. 4. The oscillation start condition is determined by the reflection coefficients in the small-signal state; namely, for oscillation start angular frequency $\omega$, $$\text{abs}(\Gamma_{S1}\Gamma_{L1}) > 1 \text{ and}$$

$$\text{phase}(\Gamma_{S1}) + \text{phase}(\Gamma_{L1}) = 0.$$

This is equivalent to the oscillation start condition when the characteristic impedances obtained by viewing the active element side and the load element side are set as $Z_{out}$ and $Z_L$, namely, $$\text{Re}\{Z_{out}(\omega)\} < 0 \text{ and } |\text{Re}\{Z_{out}(\omega)\}| > \text{Re}\{Z_L(\omega)\}$$

$$\text{Im}\{Z_{out}(\omega)\} + \text{Im}\{Z_L(\omega)\} = 0,$$

but it is more simply expressed.

Moreover, the oscillation continuation condition is determined by the reflection coefficients in the oscillation stationary state (large-signal state); for an oscillation stationary state angular frequency $\omega_0$, $$\text{abs}(\Gamma_{S1}\Gamma_{L1}) = 1 \quad (B1)$$

$$\text{phase}(\Gamma_{S1}) + \text{phase}(\Gamma_{L1}) = 0 \quad (B2).$$

This is equivalent to the oscillation start condition when the characteristic impedances obtained by viewing the active element side and the load element side are set as $Z_{out}$ and $Z_L$, namely, $$\text{Re}\{Z_{out}(\omega_0)\} < 0 \text{ and } |\text{Re}\{Z_{out}(\omega_0)\}| = \text{Re}\{Z_L(\omega_0)\}$$

$$\text{Im}\{Z_{out}(\omega_0)\} + \text{Im}\{Z_L(\omega_0)\} = 0,$$

but it is more simply expressed.

On the microwave circuit CAD software ADS of Agilent Technology, a specific circuit design is conducted for an oscillator. This is an example of the designing of a millimeter-wave oscillator (to be referred to as 60 GHz-OSC hereinbelow) for the 60 GHz band. As an equivalent circuit of an FET, a Curtis cubic model is used for simplicity.

FIG. 5(a) and (b) illustrate a design (small signal) of the oscillation start based on the above oscillation condition in a specific oscillator circuit. FIG. 5(a) shows a plotted result of the reflection coefficient at the gate terminal of the oscillator versus the frequency, and FIG. 5(b) shows a plotted result of the reflection coefficient at the drain terminal. It can be understood that the S-probe causes no perturbation in the circuit (in particular, strictly no perturbation at small signal analysis); hence, for both of (a) and (b), the oscillation start condition is satisfied at one and the same frequency (about 62 GHz) according to the oscillation theory.

FIG. 6 shows occurrence of negative resistance and a relation thereof to the oscillation start in the 60 GHz-OSC. In the diagram, Zd is a characteristic impedance obtained when viewing the active element side from the S-probe at the drain terminal. The real part of Zd in FIG. 6 indicates occurrence of negative resistance equal to or more than 50Ω in a range from about 45 GHz to about 65 GHz. In addition, the imaginary part of Zd has a clear change point from "capacitive" to "inductive" near 62 GHz, and the change point is in the frequency band in which the negative resistance is taking place. That is, the change point indicates a frequency to cause oscillation; as for the small signal, it is also implied that this oscillator is capable of conducting stable oscillation.

Description has been given of an example of analysis using a small signal in a situation in which oscillation is about to start. However, in the stationary state, the oscillator is in the large-signal state; hence, the reflection coefficient in this state is required to be calculated in the large-signal state. In the large-signal analysis, in addition to the basic tone to conduct the oscillation harmonic balance simulation, a probing large signal to sweep the frequency is applied as the second tone to the S-probe to obtain the reflection characteristic; hence, a two-tone harmonic balance analysis is conducted. When the no-loss S-probe is employed, it is not necessary to employ an extremely small value for Rx of FIG. 2 due to the assist of the negative resistance. Therefore, at large-signal analysis, it is only required to apply as the probe signal a signal of relatively small power which hardly causes perturbation in the circuit; and it is possible to obtain the reflection coefficient (impedance) in the large-signal state almost without perturbation (namely, correctly). In the relevant method, since it is required to apply a relatively large probe signal, perturbation occurs in the circuit; hence, the correct circuit characteristic cannot be obtained according to the principle of active load pull.

FIG. 7 shows the reflection coefficient at the drain terminal at stationary oscillation of the 60 GHz-OSC in the above 2-tone harmonic balance method. The 60 GHz-OSC of this report oscillates at 59.88 GHz on the simulation and oscillation power is 13.2 dBm. In the 2-tone analysis, in addition to the basic tone, a probing large signal of −30 dBm is applied via the S-probe to the circuit to obtain the reflection coefficient for each frequency by sweeping the frequency. It is recognizable that the reflection coefficient characteristic and the phase characteristic of FIG. 7 satisfy expressions (B1) and (B2), which are to be satisfied by the oscillation stationary state at 60 GHz, according to the oscillation theory. This is one of the examples indicating that the method in which the reflection coefficient (characteristic impedance) at an arbitrary point of the circuit is calculated by use of the no-loss S-probe of this report is also effective to the large-signal state. The method of applying it to an amplifier is basically similar to that of applying it to the oscillator.

The proposed no-loss S-probe on the circuit simulator can correctly obtain the reflection coefficients (impedances) at an arbitrary point of a circuit toward the left-hand section and the right-hand section of the circuit even in the large-signal state by using the negative resistance. Hence, it can be considered that the no-loss S-probe contributes to development of the oscillator design and to detection and suppression of parasitic oscillation of the amplifier. For the exemplary embodiment 1, description has been first given of the principle of the no-loss P-probe method; additionally, for the exemplary embodiment 2, description has been given of an example in which the present invention is applied to the oscillator circuit design which is the basis of the oscillation analysis and design of the microwave circuit. Application to the amplifier will be described in conjunction with an exemplary embodiment 3 and a subsequent exemplary embodiment.

Exemplary Embodiment 3

If a microwave amplifier is simply designed to have a gain in a band in which signals are to be amplified, the amplifier has an unnecessary gain outside the band in some cases. Particularly, in a situation wherein a millimeter-wave transistor is adopted as an active element, since this transistor has a gain in a range up to a high frequency of the millimeter wave band, it naturally has a larger gain for less frequency; hence, the millimeter-wave transistor has an unnecessary gain outside the band. If such unnecessary gain outside the band satisfies the oscillation condition, a parasitic oscillation takes place.

It is known that the amplifier parasitic oscillation is generally classified into even-mode oscillation and odd-mode oscillation (loop oscillation). The even mode oscillation is oscillation judged by a stability factor K. On the other hand, the odd-mode oscillation is oscillation which occurs when components connected in parallel to each other in a circuit are driven with mutually opposite phases and cannot be judged by the stability factors K or MU-value which is often used in general.

To detect danger of the odd-mode oscillation (loop oscillation) on a circuit simulator, there has been often employed a method in which a particular loop is severed from the overall circuit and the odd-mode oscillation is detected by a loop gain when a probe signal is injected by use of a circulator. However, since it is required in such conventional method to sever the particular loop of the circuit to conduct the analysis, there exists a drawback that the inherent characteristic of the overall circuit cannot be obtained. Therefore, when compared with the detection of the even-mode oscillation, the detection of the odd-mode oscillation is less quantitative, which makes it difficult to detect (or to suppress) parasitic oscillation in the amplifier.

Here, description will be given of a method for relatively simply and correctly detecting not only the even-mode oscillation, but also the odd-mode oscillation of the amplifier on a circuit simulator by using the proposed no-loss S-probe (FIG. 2 or 3); further, experimental values are compared with calculated values. In the present method, it is possible, without severing the particular loop of the circuit, to calculate the reflection coefficient (characteristic impedance) in the small-signal state and the large-signal state by inserting the no-perturbation S-probe in the circuit, i.e., in a cross section of the circuit. Hence, it is recognized that when compared with relevant methods, the even-mode parasitic oscillation and odd-mode parasitic oscillation can be more correctly detected. Moreover, by judging stability using the present method together with the relevant stabilization factors such as the K-value and the MU-value, stability of the amplifier can be more precisely designed. Also, stability of each stage of a multistage amplifier can be individually and quantitatively known.

(3-1. Amplifier Stability Analysis by S-probe Method)

FIG. 8 is a circuit diagram in which the no-perturbation S-probe is applied to the stability analysis for a multistage amplifier. To determine stability of a circuit component by the S-probe, the S-probe is inserted in a configuration in which the circuit component is sandwiched by the S-probe as shown in the diagram. The method of obtaining the reflection coefficient in a circuit cross section is based on the method described in detail in conjunction with the exemplary embodiment 1.

In general, to make an i-th stage amplifier stable, $$\text{abs}\{\Gamma_{S(i-1)}*\Gamma_{L(i-1)}\}<1 \text{ and abs}(\Gamma_{Si}*\Gamma_{Li})<1 \tag{C1}$$

is required. (Since the active element is actually not unilateral, only either one the former and latter expressions may also be ordinarily used for the two expressions). The condition required to make the overall circuit of an n-stage amplifier stable is, since each stage is required to be stable in general, $$\text{and abs}(\Gamma_{S0}*\Gamma_{L0})<1$$

$$\text{and abs}(\Gamma_{S1}*\Gamma_{L1})<1$$

$$\ldots$$

$$\text{and abs}(\Gamma_{Sn}*\Gamma_{Ln})<1 \tag{C2}$$

These form a condition more severe than that of the expression of the type of $$\text{Real}(\Gamma_{Si}*\Gamma_{Li})<1 \tag{C3}$$

of the original paper [1] of Wang et al; however, since there takes place an inconsistency wherein even if expression (C3) is satisfied, there exists a case in which an oscillation condition is satisfied according to the oscillation theory; this report hence adopts, as the stability judging formula, expression (C1) or (C2) which is faithful to the oscillation theory.

Contrarily, to make the i-th amplifier oscillate, the conditional expressions $$\text{abs}(\Gamma_{S1}*\Gamma_{L1})>1 \tag{C4}$$

$$\text{phase}(\Gamma_{S1})+\text{phase}(\Gamma_{Li})=0 \tag{C5}$$

are satisfied.

As above, in the present method, it is possible, without severing the particular loop of the circuit and without inserting a circulator therein, to calculate the reflection coefficient (characteristic impedance) in the small-signal state and the large-signal state by inserting the no-perturbation S-probe in the circuit, i.e., in a cross section of the circuit. Hence, when compared with the relevant methods, the even-mode parasitic oscillation and odd-mode parasitic oscillation can be more correctly detected. Also, stability of each stage of a multistage amplifier can be individually and quantitatively known according to expression (C1).

Hereinbelow, description will be given of an example of analysis for the even-mode oscillation and the odd-mode oscillation in a specific amplifier. First, description will be given of a method of detecting the even-mode oscillation through a small-signal analysis. Next, the detection and suppression of the odd-mode oscillation by use of a small signal will be discussed and then the stability is further examined through a large-signal analysis; finally, for the odd-mode oscillation, experimental values are compared with calculated values.

(3-2. On Even-Mode Oscillation in Amplifier)

Consider here, as a specific example of an amplifier, a V-band millimeter wave amplifier constructed by an active element in which FETs having a gate width Wg=400μm are connected in parallel to each other by use of gate and drain lead lines (FIG. 9 shows an equivalent circuit; this will be abbreviated as 60 GHz-AMP hereinbelow). As the FET, there is adopted a heterojunction FET (HJFET) of double-doped double-heterostructure with gate length Lg=0.15 µm, gate width Wg=400 µm, and a gate-metallized TiAlTi AlGaAs/InGaAs/AlGaAs channel. As the gate lead line, a phase-restoring capacitor is formed for impedance matching. An equivalent circuit model of the FET employed for the calculation is constructed on the basis of measurement results of characteristics of an FET actually manufactured as a trial product through mass production processes for millimeter wave devices. As a bias circuit, an RC bias network is applied.

FIG. 10 shows a small-signal characteristic of the amplifier of FIG. 9 on the simulation. It is recognized that at 60 GHz, there are obtained favorable input and output impedance matching and a gain of 8 dB (Vd=4 V, A-class operation). FIG. 11 shows plotting of the stabilization factor K-value. The K-value shows, near 30 GHz, a low value about one, but the value is one or more for other frequencies; as far as it is seen from the drawing, the circuit stability seems to be almost secured.

Further, FIG. 12 shows a result of stability judgment based on expression (C1) or expressions (C4) and (C5). In this case, the S-probe is inserted in a location outside the loop circuit section of the FETs connected in parallel to each other and there exists no closed loop circuit section configured via the S-probe; hence, the detection of even-mode oscillation is carried out. In FIG. 12, for the absolute value of the reflection coefficient as well as for the phase, the oscillation condition is not satisfied; hence, for the even-mode excitation, no danger of oscillation exists for the circuit, which is hence stable.

(3-3. On Odd-Mode Oscillation in Amplifier)

The even-mode oscillation of the 60 GHz-AMP has been discussed above; here, the odd-mode oscillation will be discussed.

As an amplifier to be discussed, a 60 GHz-AMP, which is completely equal to FIGS. 8 and 9 excepting the balanced resistor, will be employed as an example. To detect the odd-mode oscillation, the S-probe is inserted in a closed loop section of the circuit in which odd-mode oscillation likely occurs as shown in an equivalent circuit of FIG. 13.

The small-signal characteristic and the stability factor K-value of this amplifier are completely equal to those shown respectively in FIGS. 10 and 11 regardless of presence or absence of the balanced resistor.

FIG. 14 shows the stability factor according to expression (C1) or expressions (C4) and (C5) at the drain terminal by use of the S-probe when the balanced resistor is not applied. It can be seen that near 30 GHz, the conditions of the reflection coefficient and the phase almost satisfy the oscillation condition, and the 60 GHz-AMP is unstable near 30 GHz. To further check more precisely, the characteristic impedance Zd viewed from the drain terminal to the active element side is shown in FIG. 15. According to FIG. 15, it is recognized that the 60 GHz-AMP is not only unstable near 30 GHz, but also satisfies the oscillation condition, and has a danger to cause the odd-mode oscillation.

Additionally, FIG. 16 shows stability of the 60 GHz-AMP for the odd-mode oscillation when the balanced resistor 15Ω is applied. As can be seen from FIG. 16, it is known that as far as the small-signal level concerns, the odd-mode oscillation is suppressed by the balanced resistor.

Further, an optimization design of the balanced resistor value is conducted using the 60 GHz-AMP. FIG. 17 is a graph in which the maximum value of abs($\Gamma_{S1}*\Gamma_{L1}$)=abs(Gamma_S1*Gamma_L1) near 30 GHz is employed as the oscillation index and is plotted with respect to conductance of the balanced resistor. In this situation, the balanced resistor appropriately ranges from 15Ω to 40Ω, and 25Ω is selected as an optimal value.

Incidentally, the discussion up to now is associated with the stability analysis in the small-signal state; FIG. 18 compares the reflection coefficient for each frequency in amplifier operation of the 60 GHz-AMP using a large-signal input with that in the small-signal operation. The calculation of the reflection coefficient for the large-signal input is a 2-tone harmonic balance analysis. It is assumed in the 2-tone analysis that the input large signal to the amplifier 60 GHz-AMP has a basic tone of 60 GHz and 15 dBm and the second-tone probe signal to be inputted to the S-probe by sweeping the frequency is −30 dBm. The 60 GHz-AMP is stable for the odd-mode excitation in the small-signal operation by connecting the balanced resistor of 25Ω as shown in FIG. 18; however, with the large-signal input of 15 dBm, it shows a characteristic of unstableness at about 30 GHz (Vd=4 V, A-class operation). Further, by also calculating the phase characteristic, it can be seen that this amplifier is not only stable for the odd-mode excitation near 30 GHz, but also satisfies the oscillation condition as shown in FIG. 19. It will be considered that the odd-mode unstableness in the large-signal state detected on the circuit simulator in the no-loss S-probe method as above corresponds to "band break phenomenon" (a phenomenon in which a circuit showing a stable operation with a small signal becomes unstable when a large signal having a certain level is inputted, and shows parasitic oscillation) often seen in experiments of power amplifier operation.

Thereafter, by use of an actual amplifier, observed frequency values of parasitic oscillation, which is regarded as odd-mode oscillation, are simply compared with large-signal calculation values using the present method under one and the same condition in Table 1 (description regarding details of specifications, operation conditions, and the like of the amplifier will be omitted here).

TABLE 1

|  | Experimental values | Calculated values |
| --- | --- | --- |
| V-band amplifier | 32.178 GHz | 30.0 GHz |
| C-band amplifier | 1.514 | 1.4 |
|  | 3.104 | 3.2 |
|  | 7.041 | 6.9 |

In Table 1, the amplifier shows a stability factor K of one or more for all frequencies with the operation bias; although the operation is stable with a small signal, parasitic oscillation is shown when a large signal of a certain level is inputted in an ordinary operation. It can be hence considered that the parasitic oscillation of Table 1 is odd-mode oscillation (loop oscillation). It can be seen in this example that the method of this report is capable of also relatively quantitatively predicting and detecting parasitic oscillation. For the parasitic oscillation of the amplifier in Table 1, experimentally and in the calculation, there regrettably exist both cases in which the parasitic oscillation is suppressed or not suppressed by the application of the balanced resistor. For a further quantitative oscillation analysis using a large-signal analysis, it is required to employ a highly accurate model as the large-signal model of the active element (e.g., the EEHEMT model configured by use of ICCAP of Agilent).

In this section, description has been given of the detection of odd-mode oscillation concentrating on the outlining of the method. Due to the present method, without severing a particular loop of the circuit, the reflection coefficient (impedance) can be calculated for small-signal and large-signal operations by inserting the S-probe in a cross section of the circuit. As a result, when compared with relevant methods, the even-mode parasitic oscillation and the odd-mode parasitic oscillation can be more correctly detected. However, the stability factors related to the K-value and the MU-value still remain as strong means to analyze stability regarding the even-mode excitation of the entire circuit. Hence, by using the stability analysis according to the present method together with these method, it can be considered that the stability design of the amplifier can be more precisely realized.

Exemplary Embodiment 4

To obtain high power from an amplifier, it is required to flow a large current through the transistor as the active element. Increasing the current flowing through the transistor is achieved by conducting an optimal design of the active layer and by operating a plurality of transistors in a parallel configuration. However, if the transistors are simply arranged by use of lead lines in a parallel configuration as an active element, odd-mode oscillation (loop oscillation) may be caused depending on cases. In a situation wherein the odd-mode oscillation occurs, there is at present no effective measure to securely suppress the odd-mode oscillation. Another method to obtain high power is arranging unitary amplifiers in a parallel configuration by use of a power distributing and coupling unit and a hybrid. However, also in this case, it cannot be considered that there exists no danger of odd-mode oscillation depending on the parallel configuration method.

In this report, description will be first given of a systematic method in which to check circuit stability when a parallel-type amplifier is constructed, the stability is known from the reflection coefficient (characteristic impedances) of a circuit cross section by use of the proposed no-loss S-probe. Next, for the stability of the parallel-configuration amplifier, particularly, resistivity against the odd-mode excitation, the difference thereof will be compared according to the types of power distributing and coupling units and hybrids employed.
(4-1. Systematic Method of Checking Stability of Parallel-Type Amplifier)

Stability of a circuit can be judged, according to the oscillation theory, by obtaining the reflection coefficients in the forward direction and the backward direction in an arbitrary cross section of the circuit. To obtain the reflection coefficients in the cross section of the circuit, it is convenient to adopt the proposed no-loss S-probe which causes no loss even if it is inserted in the circuit and which is available in small-signal and large-signal operations.

To make the circuit stable, it is required that $$\text{abs}(\Gamma_S * \Gamma_L) < 1 \tag{D1}$$

holds at any virtual cross-sectional point of the circuit. Additionally, to make the circuit be about to oscillate, it is required that $$\text{abs}(\Gamma_S * \Gamma_L) > 1 \tag{D2 and}$$

$$\text{phase}(\Gamma_S) + \text{phase}(\Gamma_L) = 0 \tag{D3}$$

hold at a virtual cross-sectional point in the small-signal state. In the stationary oscillation state in which the circuit oscillates continuously, $$\text{abs}(\Gamma_S * \Gamma_L) = 1 \tag{D4 and}$$

$$\text{phase}(\Gamma_S) + \text{phase}(\Gamma_L) = 0 \tag{D5}$$

hold at any virtual cross-sectional point in the large-signal state. If the stability condition of expression (D1) is not satisfied as well as the stability conditions of expressions (D2) and (D3) are not satisfied at a virtual cross-sectional point in the circuit, the circuit does not oscillate or the circuit oscillates, but does not conduct stable oscillation in many cases.

Circuit stability of the parallel-type amplifier can be checked by applying the above method. FIG. 20 shows structure of a circuit for checking stability in the parallel-type amplifier. Ordinarily, the signal attenuation quantity of the attenuator is set to zero. In FIG. 20, if the oscillation condition is satisfied in S-probe 1 (or 1'), even-mode parasitic oscillation occurs in the circuit. Therefore, in this case, the oscillation condition is ordinarily satisfied in probe 2 (or 2'). On the other hand, in a situation wherein the oscillation condition is satisfied in the probe 2 (or 2') in the closed-loop circuit, but unstableness is not observed in the probe 1 (or 1') outside the loop; odd-mode parasitic oscillation (loop oscillation) occurs in the circuit. In a case wherein when even-mode parasitic oscillation occurs and odd-mode oscillation concurrently occurs in the closed loop, if the signal attenuation quantity is increased by the attenuator in FIG. 20, the oscillation is stopped in the probe 1 (or 1'), but the oscillation condition is continuously observed in the probe 2 (or 2') in the closed loop; in this way, the concurrent occurrence of odd-mode oscillation can be checked.

The method in which the circuit stability is judged by calculating the reflection coefficient in a virtual cross section of the circuit as above is quite a clear method according to the oscillation theory since, for example, whether the parasitic oscillation is due to even-mode excitation or odd-mode excitation is easily judged.

In the oscillation analysis of an oscillator, the probe to calculate the reflection coefficient is ordinarily inserted in an output side of the active element (ordinarily, in the drain terminal for an FET). On the other hand, in the parasitic oscillation analysis of an oscillator, if the probe to calculate the reflection coefficient is inserted in an input side of the active element (ordinarily, in the gate terminal for an FET), it is likely to detect unstableness in many cases. This is because in the case of an amplifier, a reflection wave from the active element caused due to difficulty in establishing input matching remains as a standing wave in the closed loop formed in the circuit and becomes the primary cause to induce odd-mode oscillation (loop oscillation).
(4.2. Contribution of Various Power Distributing and Coupling Units and Hybrids to Circuit Stability)

In general, a method of power-coupling unitary amplifiers for which it has been confirmed that neither even-mode parasitic oscillation nor odd-mode parasitic oscillation occurs therein for power-coupling by use of a power distributing and coupling unit and a hybrid is regarded as an effective method to double the power from the amplifier while keeping the circuit stability secured. This is because the power distributing and coupling unit and the hybrid have a function to distribute and to couple power in an operation band as well as a function to cut unnecessary signals outside the band; also, the Wilkinson power distributing and coupling unit or the like has also a function to isolate ports for signal coupling and distribution. It has been experimentally known that the feared loss in the power distributing and coupling can be simply reduced by devising the manufacturing of the power distributing and coupling unit such that the manufacturing is carried out according to designed values as strictly as possible; hence, it will not be a problem.

However, it does not mean that every power distributing and coupling unit or hybrid can carry out some effect of the power coupling operation and the circuit stabilization. Accordingly, a method of selecting a circuit configuration by use of the method described above will be discussed hereinbelow in which difference in the stability of the parallel-structure amplifier, particularly, in the resistivity against the odd-mode excitation due to the kinds of the power distributing and coupling unit and the hybrid is compared to select a circuit configuration most favorable to the power coupling in accordance with each purpose.

First, as an example of a specific amplifier corresponding to the unitary amplifier of FIG. 20, let us consider a 60 GHz-band millimeter wave amplifier including FET as an active element which has a gate width of Wg=400 μm (to be abbreviated as 60 GU-AMP hereinbelow). As the FET, there is adopted a heterojunction FET (HJFET) which has gate length Lg=0.15 μm and double-doped double-heterostructure with a gate-metallized TiAlTi AlGaAs/InGaAs/AlGaAs channel. As the gate lead line, a phase-restoring capacitor is formed for impedance matching. An RC bias network is applied to the bias circuit.

FIG. 21 shows the small-signal characteristic of the amplifier of the trial product (S parameter of an amplifier prepared by re-configuring a small-signal FET equivalent circuit model configured to faithfully reproduce the measured S parameter; S-parameter not actually measured is also calculated for frequencies equal to or more than 80 GHz). It is recognized that favorable input/output impedance matching is attained at 60 GHz and a gain of 5.5 dB is obtained (Vd=4 V, A-class operation).

FIG. 22 shows plotting of the stability factor K-value. The K-value shows a low value of about one at a little less than 30 GHz and is equal to or more than one for the other frequencies, and stability against the even-mode excitation is secured. Also, in this trial product, no parasitic oscillation is observed in an actual evaluation; it can be hence considered that stability against the odd-mode excitation is also secured. Further, in a power evaluation for the 60 GHz band, Psat=21.0 dBm is obtained.

Next, the circuit stability of a parallel amplifier which has the circuit configuration of FIG. 20 and which aims to double the power in the 60 GHz band by employing the amplifier 60 GU-AMP of FIG. 21 as the unitary amplifier is examined.

(4-2-1. Power Distributing and Coupling by Y-Branch)

First, an amplifier of FIG. 23 in which 60 GU-AMP are arranged in a parallel configuration by using a Y-branch (or a T-branch) including only simple wiring is considered. For the Y-branch and wiring sections, models constructed on the ADS are employed.

FIG. 24 shows the small-signal characteristic of a Y-branch parallel amplifier. Since there exists input/output impedance mismatching due to the Y-branch, deterioration in the matching level is seen on the input side and a shift in the matching frequency is seen on the output side.

FIG. 25 shows the stability factor K of the Y-branch parallel amplifier. Near 25 GHz, the K-value is about one, but the stability factor K indicates a value equal to or more than one for all frequencies ranging from DC to 100 GHz; it is hence known that this amplifier is stable for the even-mode excitation.

FIG. 26 shows the stability for the odd-mode excitation of the Y-branch parallel amplifier based on expressions (D2) and (D3) by use of the S-probe inserted in the circuit as shown in FIG. 9. Along the left Y-axis, the stability factor (D2) for the reflection coefficient is plotted; and along the right Y-axis, the phase condition (D3) is plotted. As can be seen from this graph, it is recognizable that the oscillation start condition is satisfied at about 75 GHz in this amplifier and there exits danger of occurrence of odd-mode parasitic oscillation. The Y-branch has merits of the smallest circuit size and simple structure, but has not the isolation function between distributing (or coupling) ports; hence attention is to be given to that the odd-mode parasitic oscillation easily occurs in the Y-branch power distributing and coupling parallel amplifier as above. However, there may be considered a scheme wherein when wiring loss and Y-branch loss are relatively large, the circuit is turned to be stabilized by using the loss.

(4-2-2. Wilkinson In-Phase Power Distribution and Coupling)

Next, an amplifier shown in FIG. 27 in which 60 GU-AMP are arranged in a parallel configuration using the Wilkinson power distributing and coupling unit is considered. For the 60 GHz-band Wilkinson power distributing and coupling unit and wiring sections, models constructed on ADS are used. FIG. 28 shows the small-signal characteristic of the Wilkinson-type parallel amplifier. A favorable matching characteristic is shown for both of the input and output sides. FIG. 29 shows the stability factor K of the Wilkinson-type parallel amplifier. For all frequencies ranging from DC to 100 GHz, the stability factor K is more than one; it is hence recognizable that this amplifier is stable for the even-mode excitation.

FIG. 30 shows the stability for the odd-mode excitation of the Wilkinson-type parallel amplifier based on expressions (D2) and (D3) by use of the S-probe inserted in the circuit as shown in FIG. 27. The stability factor (D2) calculated from the reflection coefficient is sufficiently reduced to a value less than one in a wide band ranging from DC to 100 GHz; it can be hence recognized that this amplifier is fully stable for the odd-mode excitation. As above, in the Wilkinson power distribution and coupling unit, the isolation resistor has an isolation function not only for signals within the band, but also for signals with wider frequencies outside the band; hence, it can be considered that the amplifier constructed in the parallel structure by use of the Wilkinson power distribution and coupling unit has high stability in a wide band for the odd-mode excitation.

(4-2-3. Balance-Type Power Distribution and Coupling by 90-Degree Hybrid)

Next, an amplifier shown in FIG. 31 in which 60 GU-AMP are disposed in a parallel configuration using a 90-degree hybrid is considered. In this case, a branch line coupler of 60 GHz-band operation is selected as the 90-degree hybrid. For the branch line coupler and wiring sections, models constructed on ADS are used. FIG. 32 shows the small-signal characteristic of the 90-degree hybrid balance-type amplifier. Quite a favorable matching characteristic is shown in a sufficiently wide band for both of the input and output sides. In general, for the balance-type amplifier using the 90-degree hybrid, reflection power from each unitary amplifier to the input and output ports is entirely absorbed by the hybrid termination resistor within the band; the amplifier hence has an advantage in which even if the input/output impedance of the unitary amplifier differs from the route impedance Zo (ordinarily 50Ω), it seems as if the input/output impedance of the balance-type amplifier is kept at Zo. Hence, for an amplifier for which the input/output matching is not easily established, the input/output matching is facilitated for the amplifier by employing the configuration of the balance-type amplifier. FIG. 33 shows the stability factor K of the 90-degree hybrid balance-type amplifier. The stability factor K is more than one for all frequencies ranging from DC to 100 GHz, and it is hence recognized that this amplifier is stable for the even-mode excitation.

FIG. 34 shows the stability for the odd-mode excitation of the 90-degree hybrid balance-type amplifier based on expressions (D2) and (D3) by use of the S-probe inserted in the circuit as shown in FIG. 31. The stability factor (D2) calculated from the reflection coefficient is less than one in a wide band ranging from DC to 100 GHz; it is hence recognizable that this amplifier is fully stable for the odd-mode excitation. However, near 25 GHz, the stability factor (D2) according to the reflection coefficient is in the vicinity of one, and an unnecessary gain is attained also in FIG. 32; hence, it cannot be asserted that sufficient stability is secured in the large-signal input operation. As above, for the balance-type amplifier employing the 90-degree hybrid, reflection power from each unitary amplifier between the distribution (or coupling) ports is not fully isolated outside the band of the hybrid; therefore, the amplifier cannot be considered to be sufficient with respect to the stability for the odd-mode excitation.

(4-2-4. Push-Pull Power Distribution and Coupling by 180-Degree Hybrid)

Next, a push-pull amplifier shown in FIG. 35 in which 60 GU-AMP are disposed in a parallel configuration by use of a 180-degree hybrid is considered. The push-pull amplifier generally has a merit in which higher harmonics of even-numbered degrees cancel out in the output wave. Here, a rat-race hybrid of 60 GHz-band operation is selected as the 180-degree hybrid. For the rat-race hybrid and wiring sections, models constructed on ADS are adopted. FIG. 36 shows the small-signal characteristic of the 180-degree hybrid push-pull amplifier. A favorable matching characteristic is shown for both of the input and output sides. FIG. 37 shows the stability factor K of the 180-degree hybrid push-pull amplifier. The stability factor K is more than one for all frequencies ranging from DC to 100 GHz, and it can be hence recognized that this amplifier is stable for the even-mode excitation.

FIG. 38 shows the stability for the odd-mode excitation of the 180-degree hybrid push-pull amplifier based on expressions (D2) and (D3) by use of the S-probe inserted in the circuit as shown in FIG. 34. The stability factor (D2) calculated from the reflection coefficient is less than one in a wide band ranging from DC to 100 GHz; it is hence recognizable that this amplifier is stable for the odd-mode excitation. However, judging simply, the stability factor according to the reflection coefficient is in the vicinity of one for frequencies near 25 GHz; hence, it cannot be simply asserted that this amplifier, like the 90-degree hybrid balance-type amplifier, is fully stable in the large-signal operation. The evaluation of FIG. 38 is obtained by using a rat-race hybrid in which a certain degree of isolation is provided between the distribution (or coupling) ports is employed as the 180-degree hybrid. In a situation wherein a Marchand balun is used as the 180-degree hybrid, although there exists a merit that the phase shift quantity is kept at 180 degrees in the wide band as compared with the rat-race hybrid, the isolation between the distribution (or coupling) ports is insufficient, i.e., about 5 dB; hence, the stability in the large-signal operation is less secured when compared with the case in which the rat-race hybrid is adopted.

However, from another point of view, in the configuration of the push-pull amplifier, the unitary amplifiers are mutually excited with the reverse phases in the regular operation mode. Therefore, it can also be considered that the push-pull amplifier is easily odd-mode excited. Particularly, in the V-band, it is difficult even in the Wilkinson power distributing and coupling unit to form an isolation resistor showing sufficient isolation of at least 20 dB; therefore, for power distribution and coupling of the amplifier, it can be considered that the method intentionally adopting the push-pull-type parallel amplifier in which odd-mode excitation easily occurs is also effective.

The respective exemplary embodiments described above are favorable exemplary embodiments and can be modified in various ways within a scope of the present invention.

This application is based upon and claims the benefit of priority from Japanese patent application No. 2006-314700, filed on Nov. 21, 2006, the disclosure of which is incorporated herein in its entirety by reference.

INDUSTRIAL APPLICABILITY

As described in conjunction with detailed and abundant examples, the circuits or methods of the present invention are capable of correctly obtaining the reflection coefficient (characteristic impedance) in the large-signal state of a circuit; hence, the circuits or methods make the design of the oscillator more precise as well as give us important knowledge regarding the stability of a multistage amplifier, loop oscillation in an amplifier, the stability of a balance-type amplifier, and the like. Therefore, the circuits or methods of the present invention advantageously contribute to the designs and evaluations of an amplifier, an oscillator, and the like which operates in a microwave or millimeter-wave band.

BRIEF DESCRIPTION OF DRAWINGS

FIG. 2 is a diagram showing a general circuit configuration of a proposed no-loss S-probe.

FIG. 5 is a diagram showing designs of oscillation start of an oscillator; (*a*) viewed at the gate terminal and (*b*) viewed at the drain terminal.

FIG. 7 is a diagram showing the characteristic at stationary oscillation by the large-signal analysis.

FIG. 8 is a diagram showing the amplifier stability analysis by an S-probe.

FIG. 10 is a diagram showing the small-signal characteristic of a 60 GHz amplifier.

FIG. 14 is a diagram showing the stability ("without" balanced resistor) for odd-mode excitation of the 60 GHz amplifier.

FIG. 15 is a diagram showing odd-mode excitation (without balanced resistor) of the 60 GHz amplifier.

FIG. 16 is a diagram showing the stability ("with" balanced resistor) for odd-mode excitation of the 60 GHz amplifier.

FIG. 17 is a diagram showing an optimal design of the balanced resistor value.

FIG. 18 is a diagram showing comparison between the small-signal input and the large-signal operation input.

FIG. 22 is a diagram showing the stability factor K of the unitary amplifier.

FIG. 25 is a diagram showing the stability factor K of the Y-branch parallel amplifier.

FIG. 28 is a diagram showing the small-signal characteristic of the Wilkinson-type parallel amplifier.

FIG. 32 is a diagram showing the small-signal characteristic of the balance-type amplifier using a 90-degree hybrid.

FIG. 33 is a diagram showing the stability factor K of the balance-type amplifier using a 90-degree hybrid.

FIG. 38 is a diagram showing the odd-mode stability of the push-pull amplifier using a 180-degree hybrid.

Figure 1:
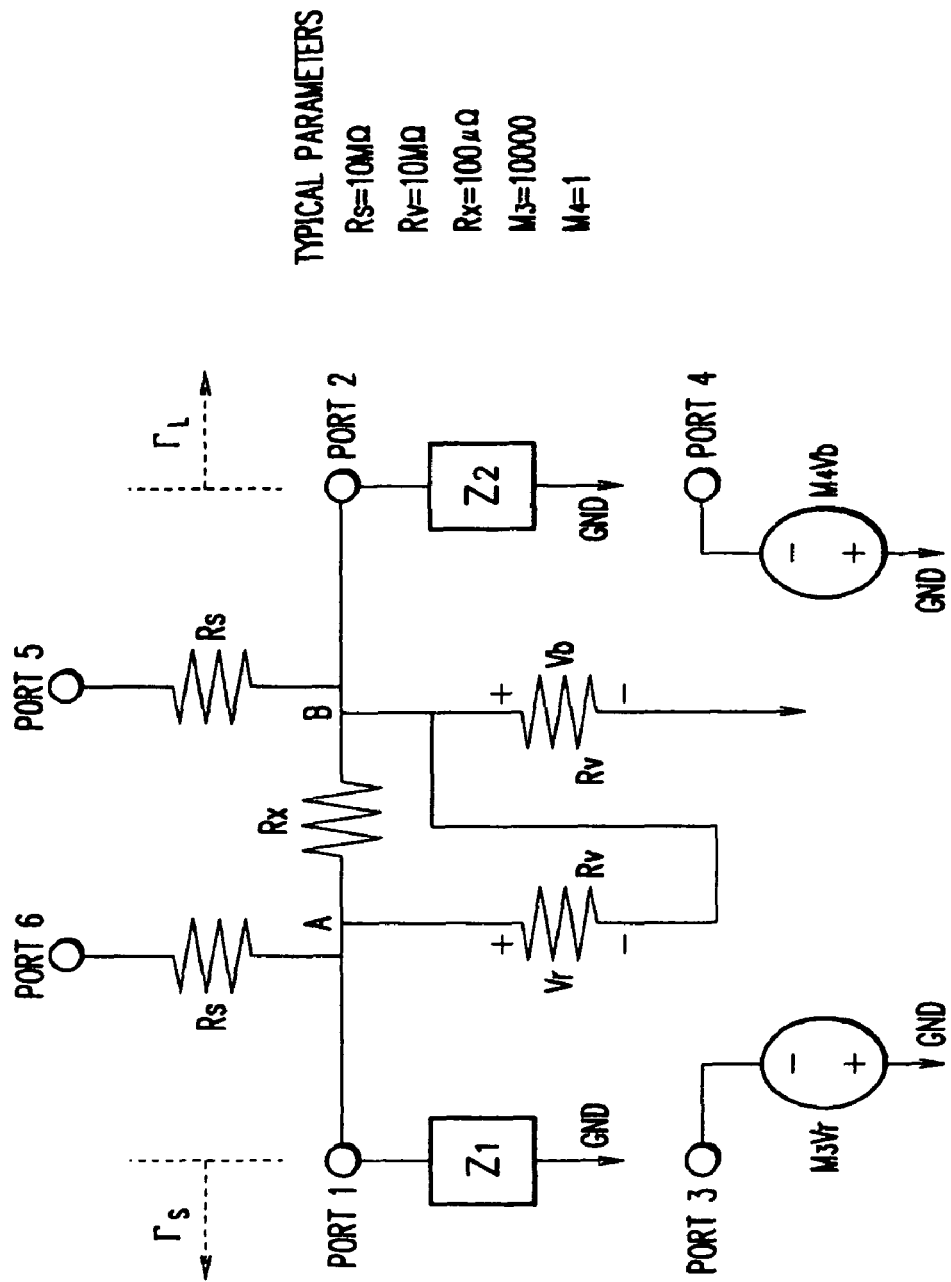
FIG. 1 is a diagram showing a circuit configuration of a relevant S-probe.
Figure 3:
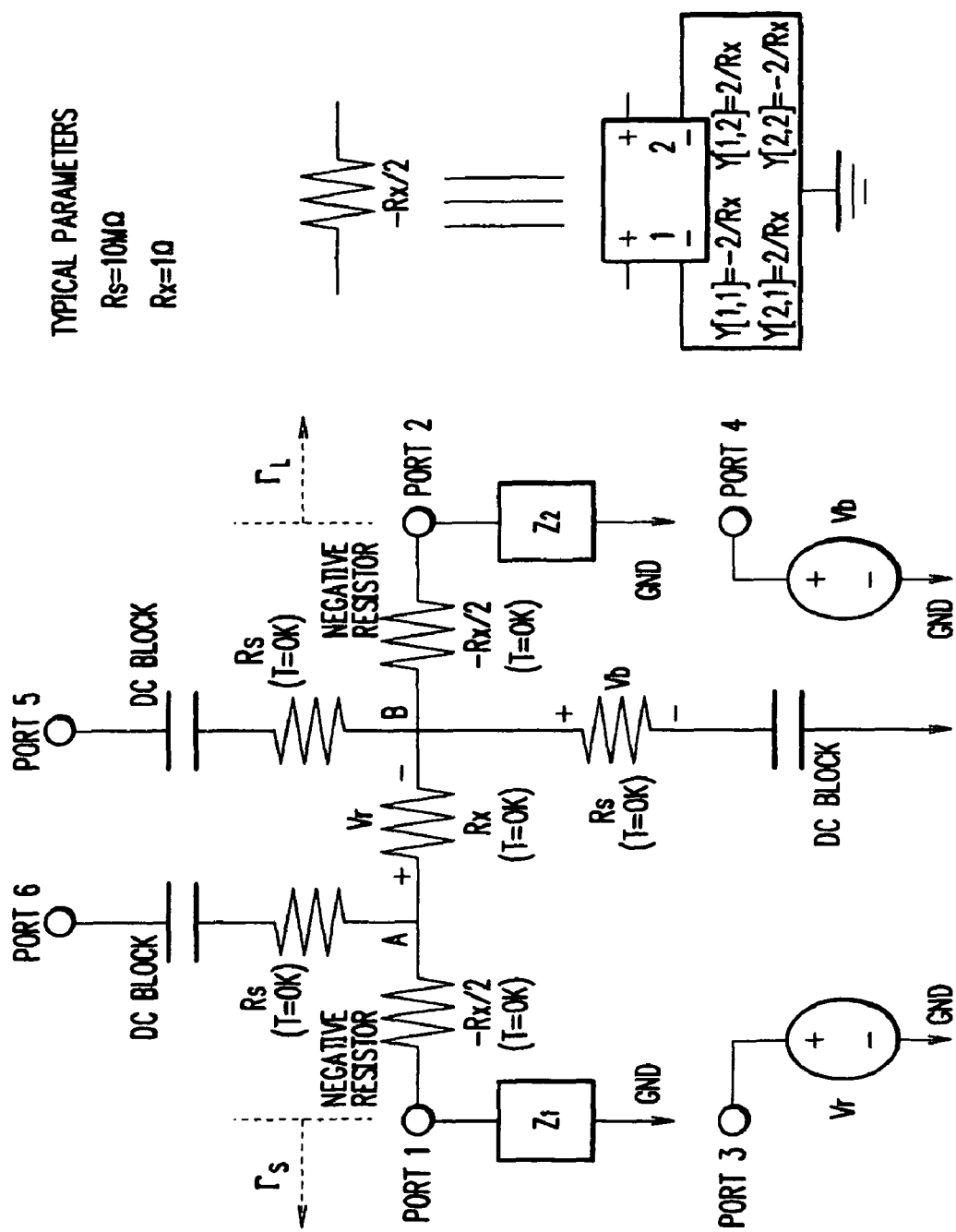
FIG. 3 is a diagram showing a typical circuit configuration of a proposed no-loss S-probe.
Figure 4:
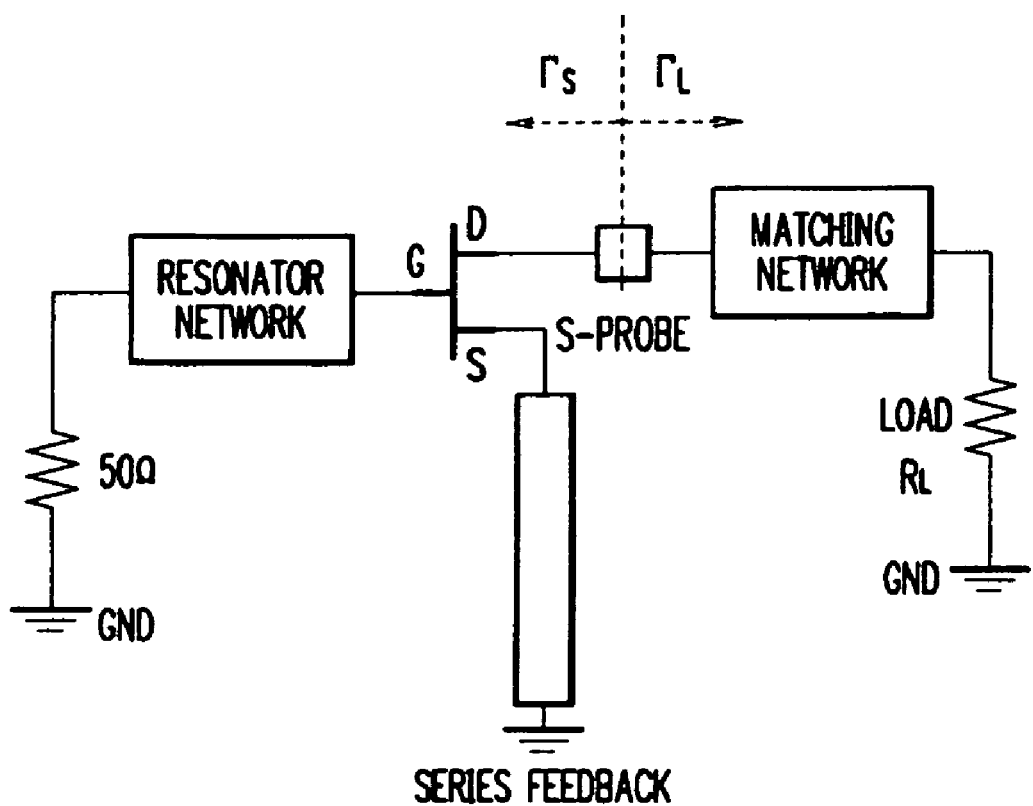
FIG. 4 is a diagram showing a basic circuit configuration of an oscillator.
Figure 6:
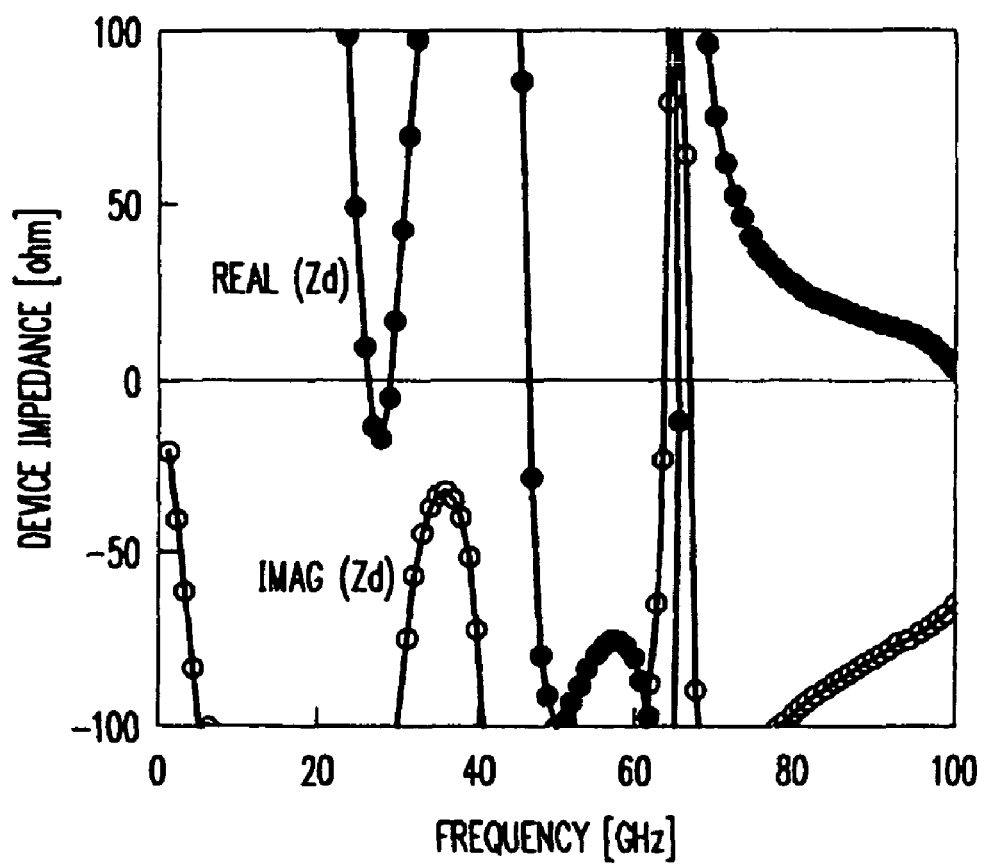
FIG. 6 is a diagram showing the analysis and the design of the negative resistor.
Figure 9:
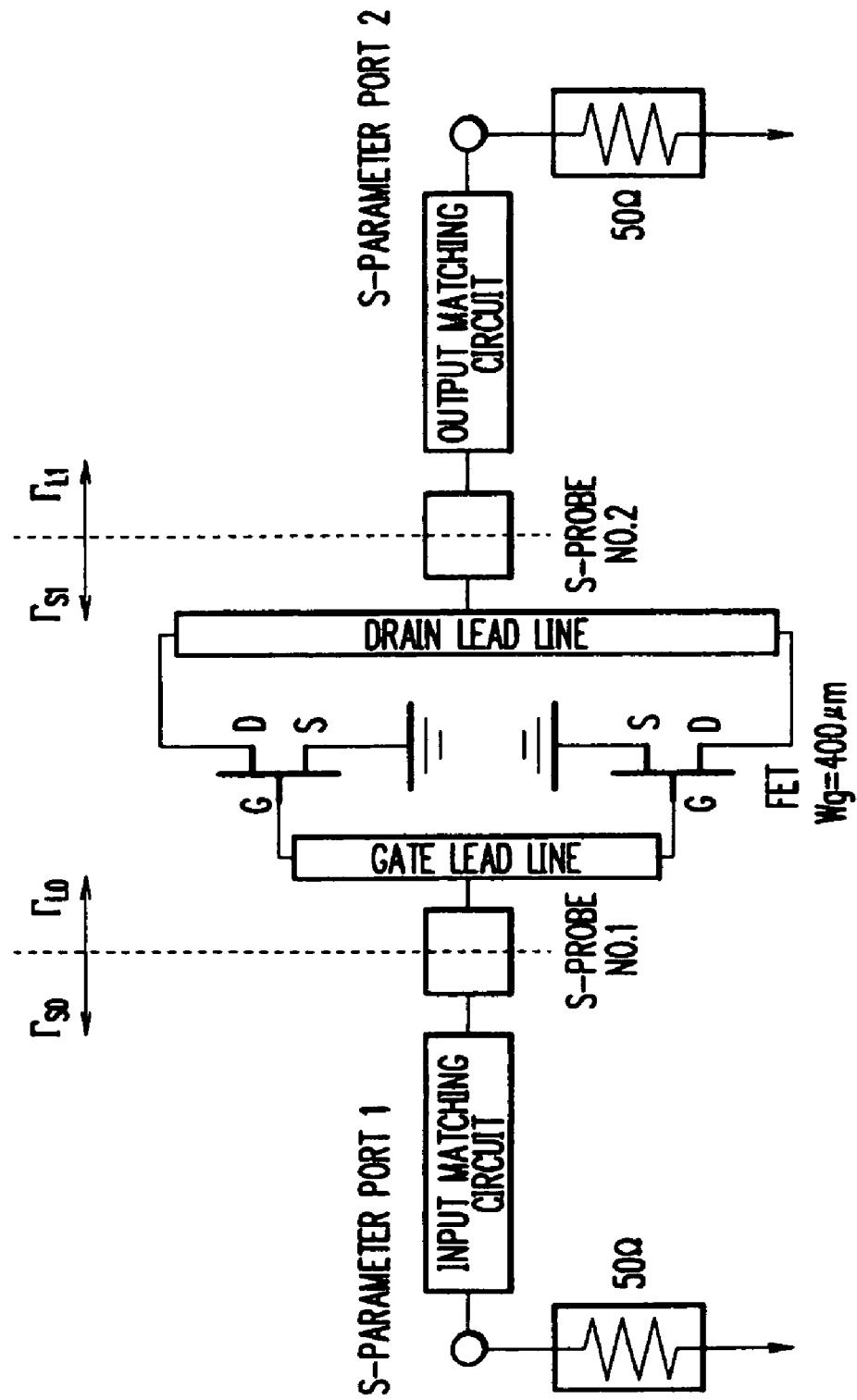
FIG. 9 is a diagram showing detection (equivalent circuit) of even-mode oscillation in an S-probe method.
Figure 11:
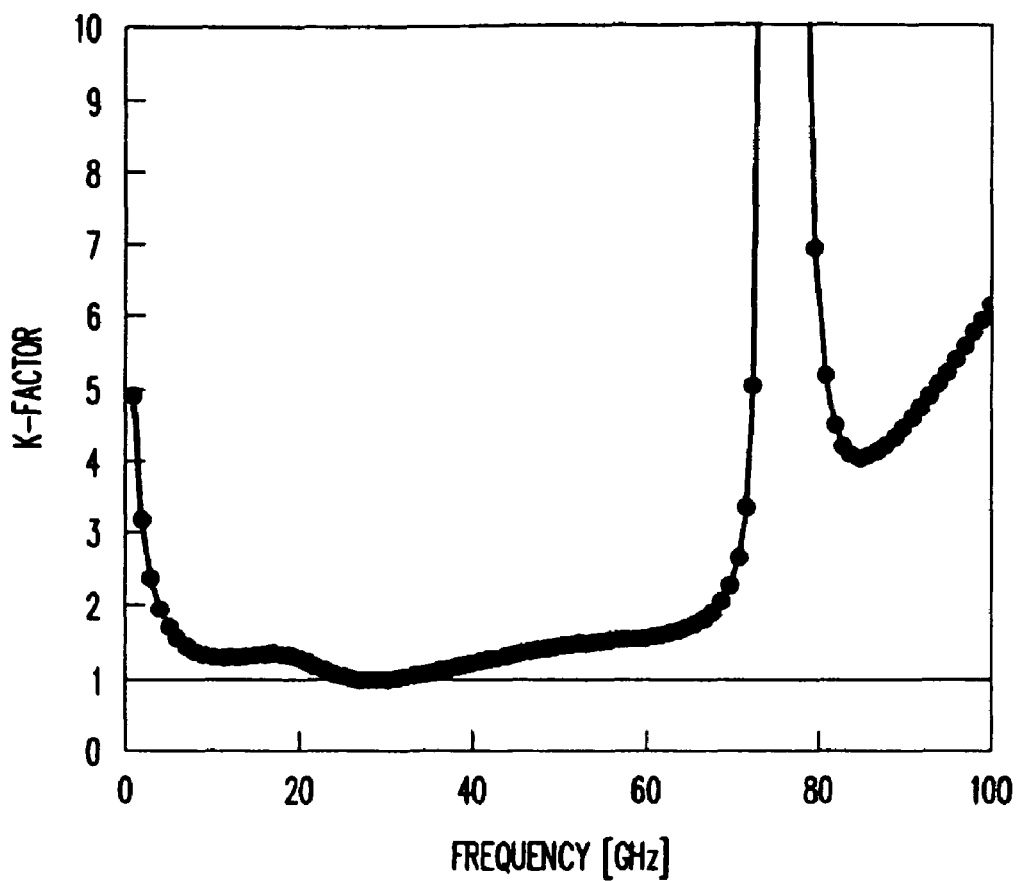
FIG. 11 is a diagram showing the stability factor K of the 60 GHz amplifier.
Figure 12:
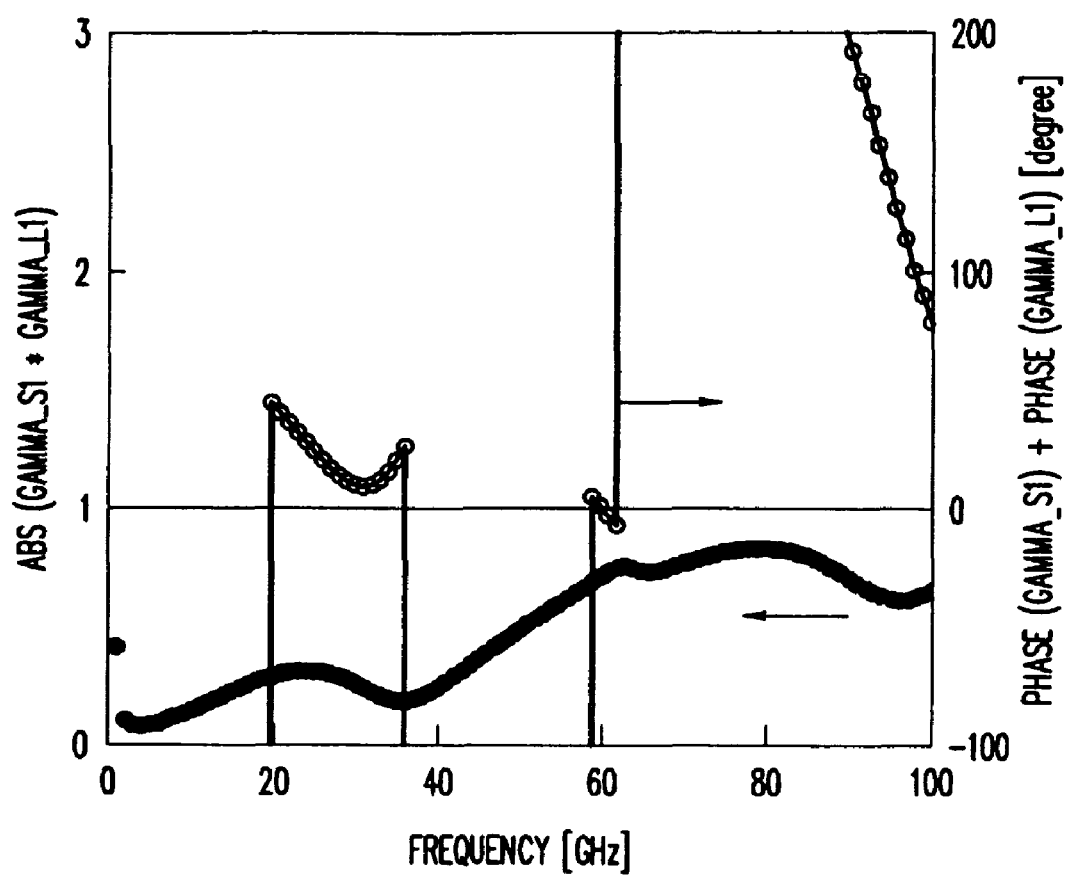
FIG. 12 is a diagram showing the stability of the 60 GHz amplifier in the even mode.
Figure 13:
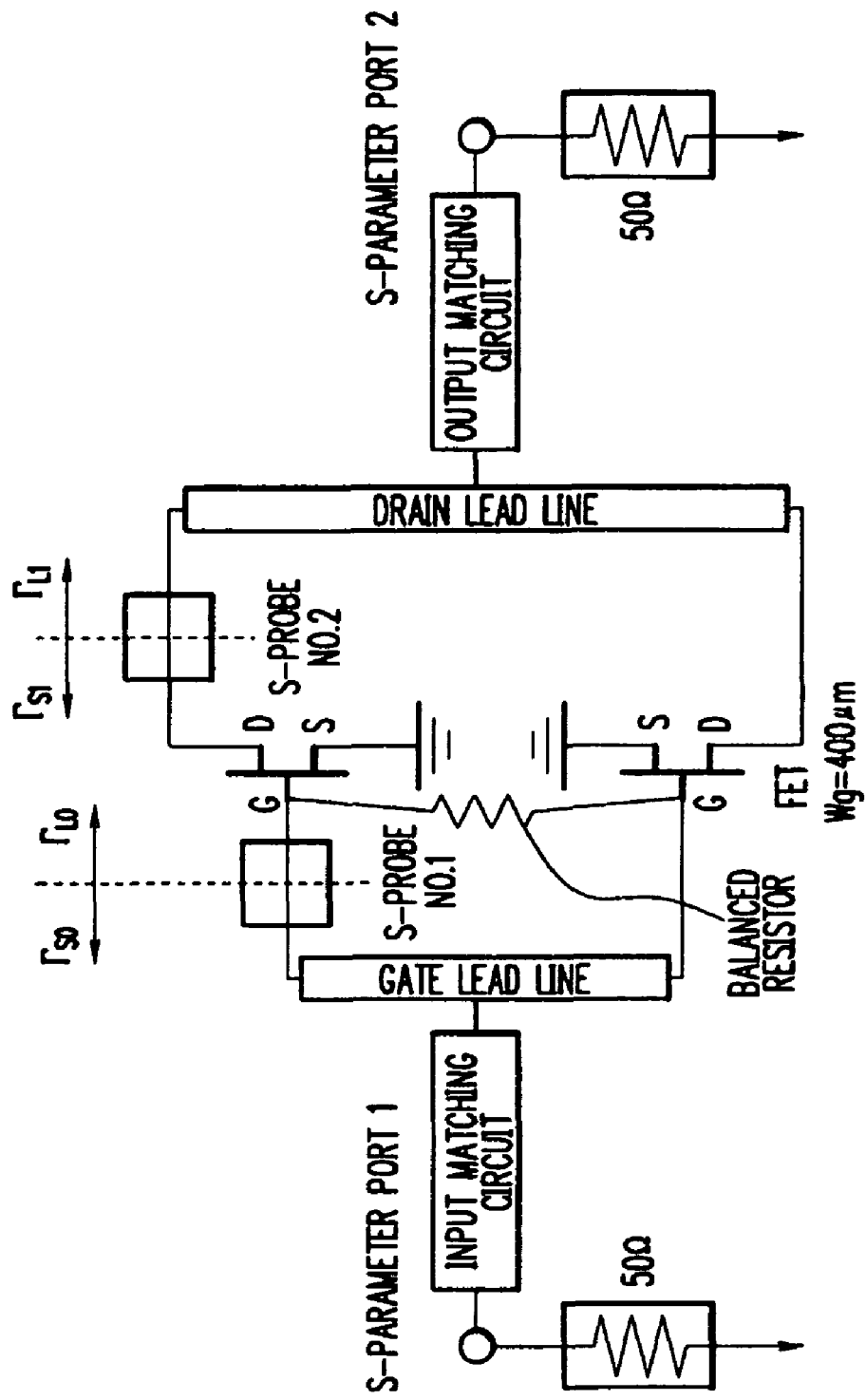
FIG. 13 is a diagram showing detection (equivalent circuit) of odd-mode oscillation by an S-probe method.
Figure 19:
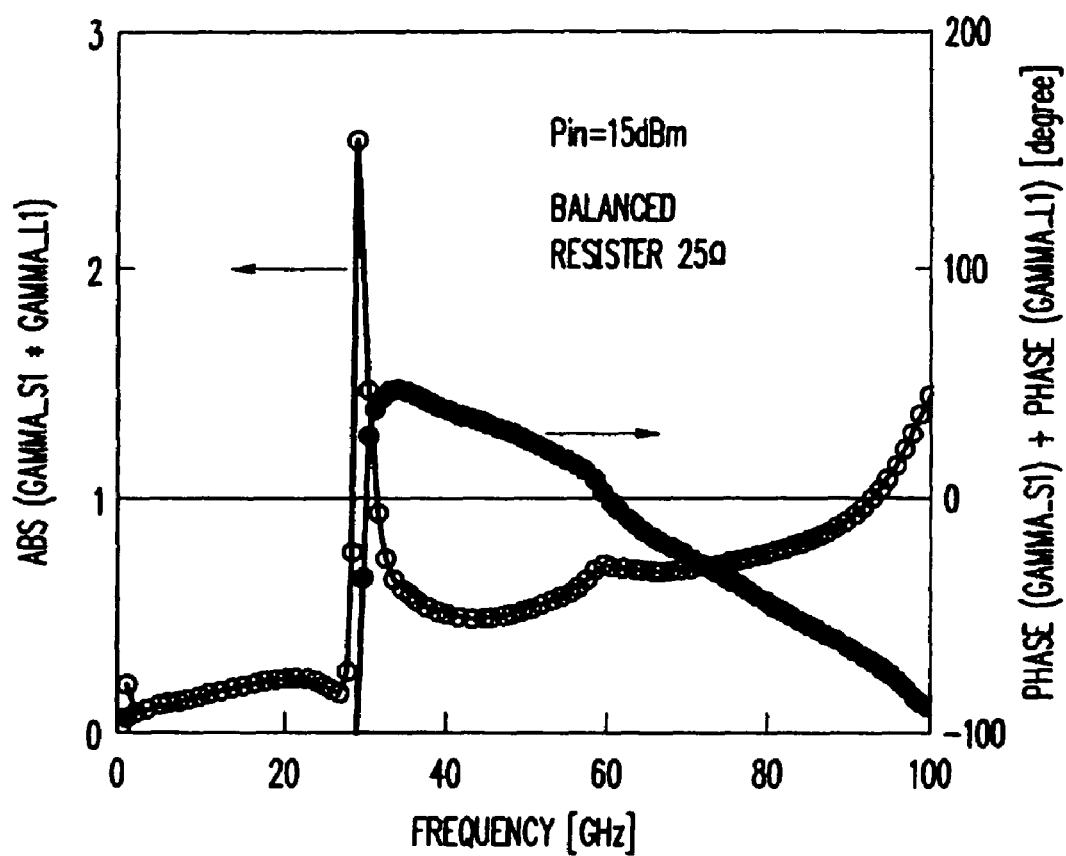
FIG. 19 is a diagram showing the stability when a large signal is inputted.
Figure 20:
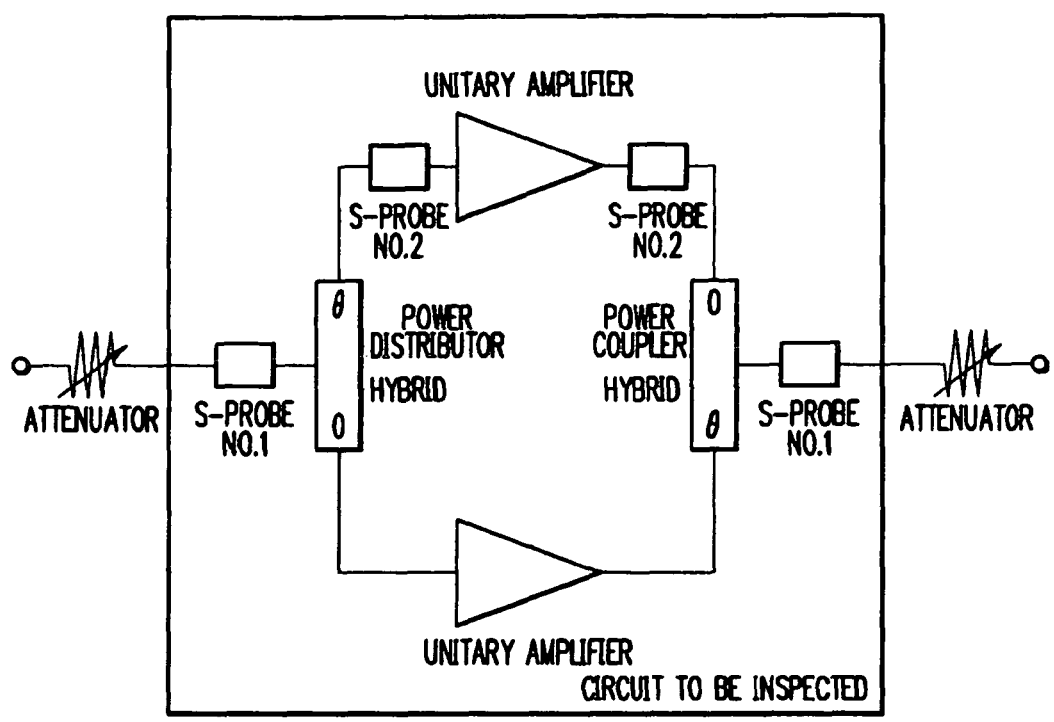
FIG. 20 is a diagram showing a stability checking circuit configuration in a parallel-type amplifier.
Figure 21:
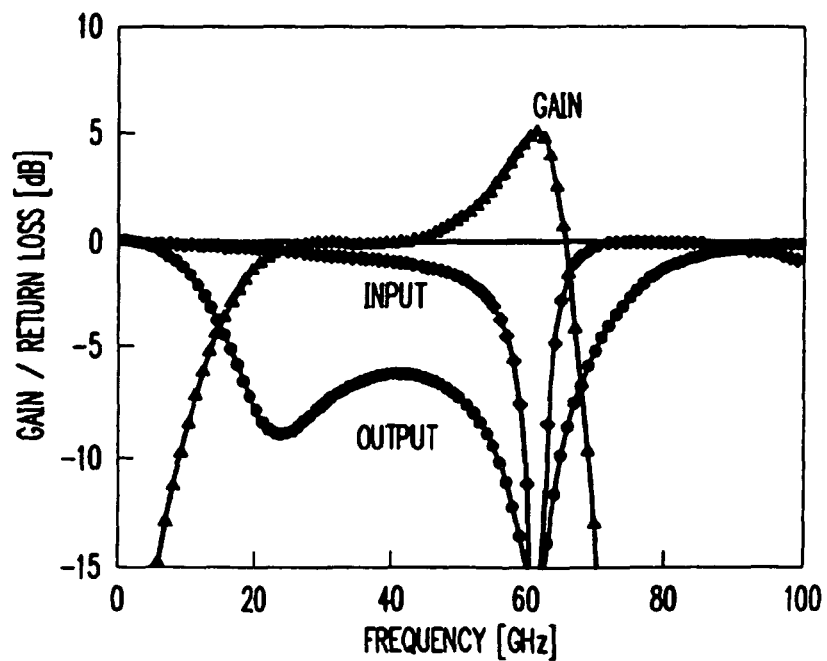
FIG. 21 is a diagram showing the small-signal characteristic of a unitary amplifier.
Figure 23:
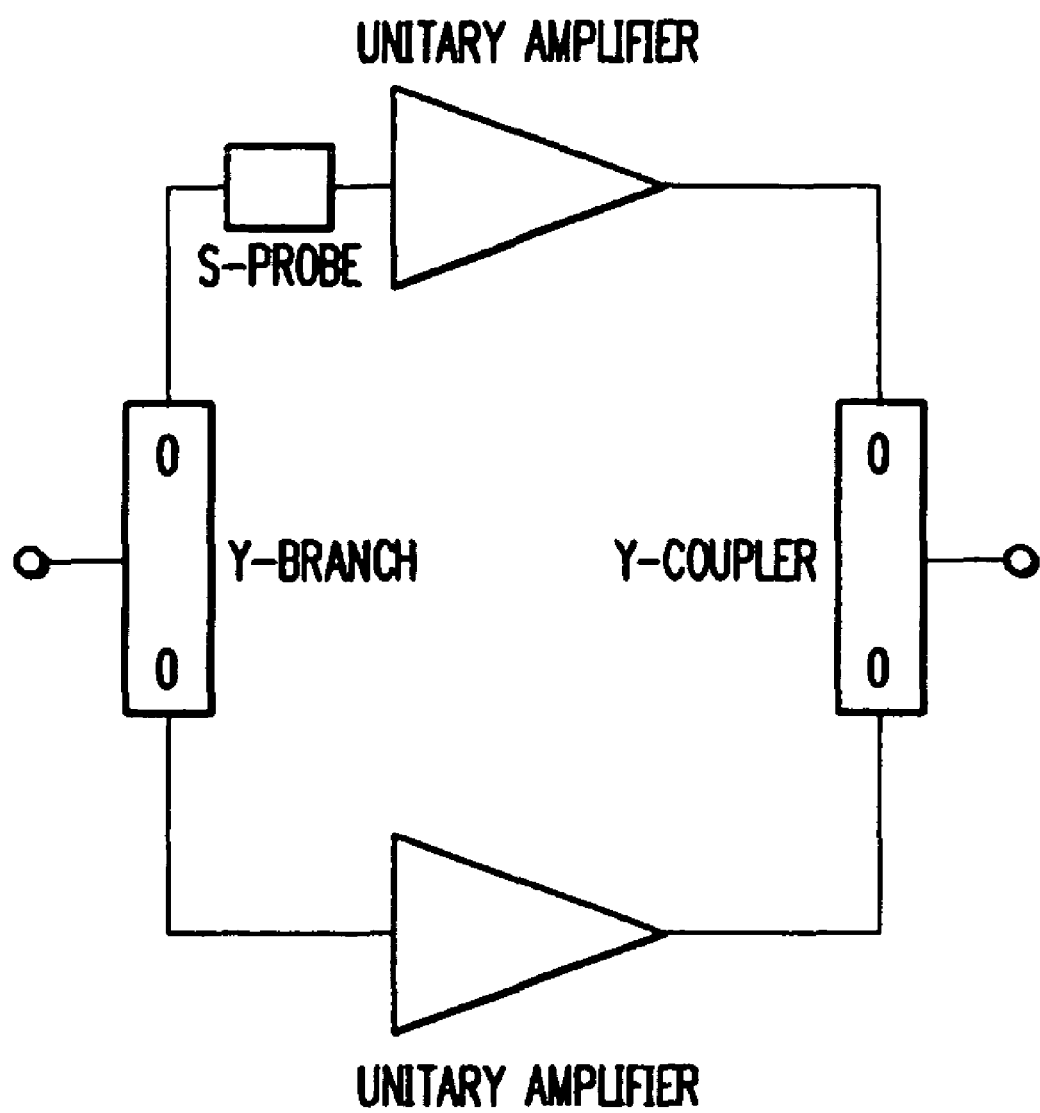
FIG. 23 is a diagram showing a parallel amplifier employing a Y-branch.
Figure 24:
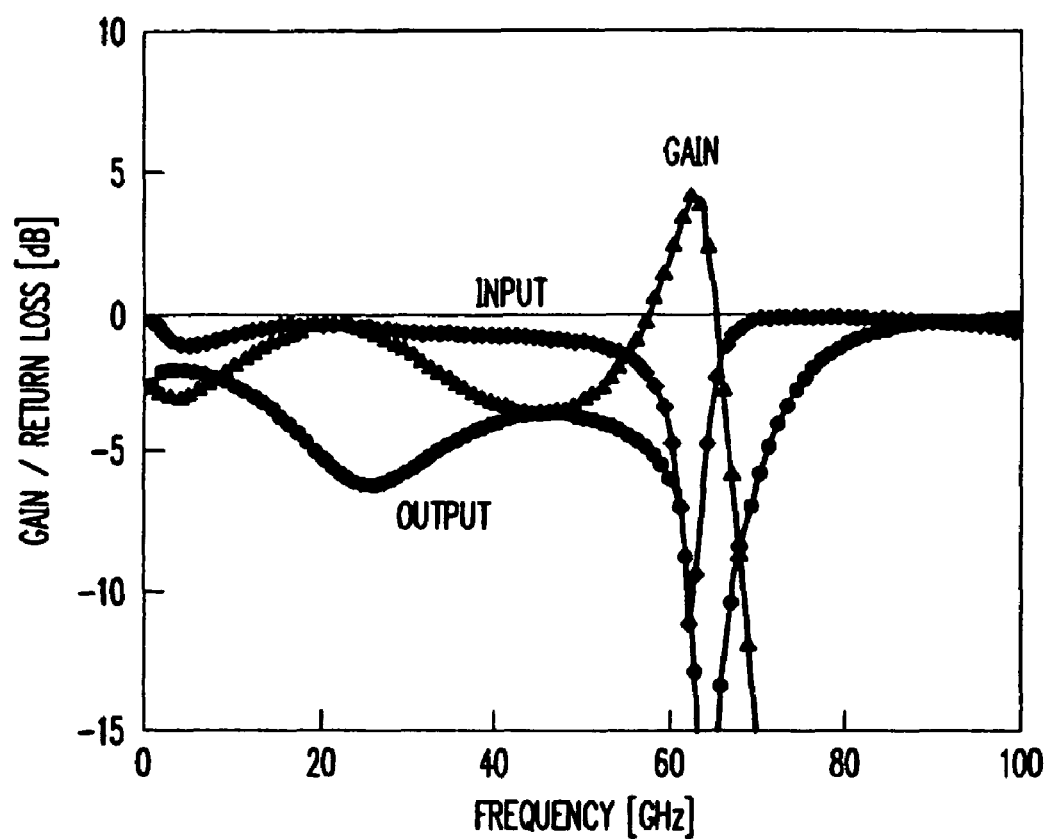
FIG. 24 is a diagram showing the small-signal characteristic of the Y-branch parallel amplifier.
Figure 26:
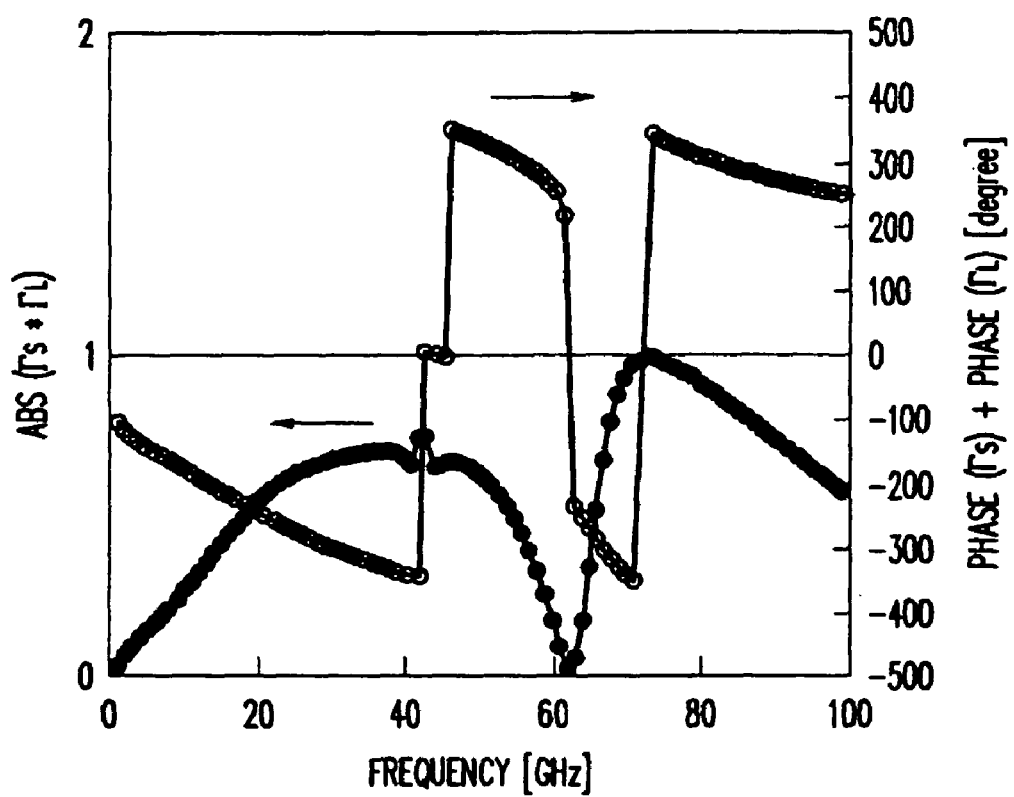
FIG. 26 is a diagram showing the odd-mode stability of the Y-branch parallel amplifier.
Figure 27:
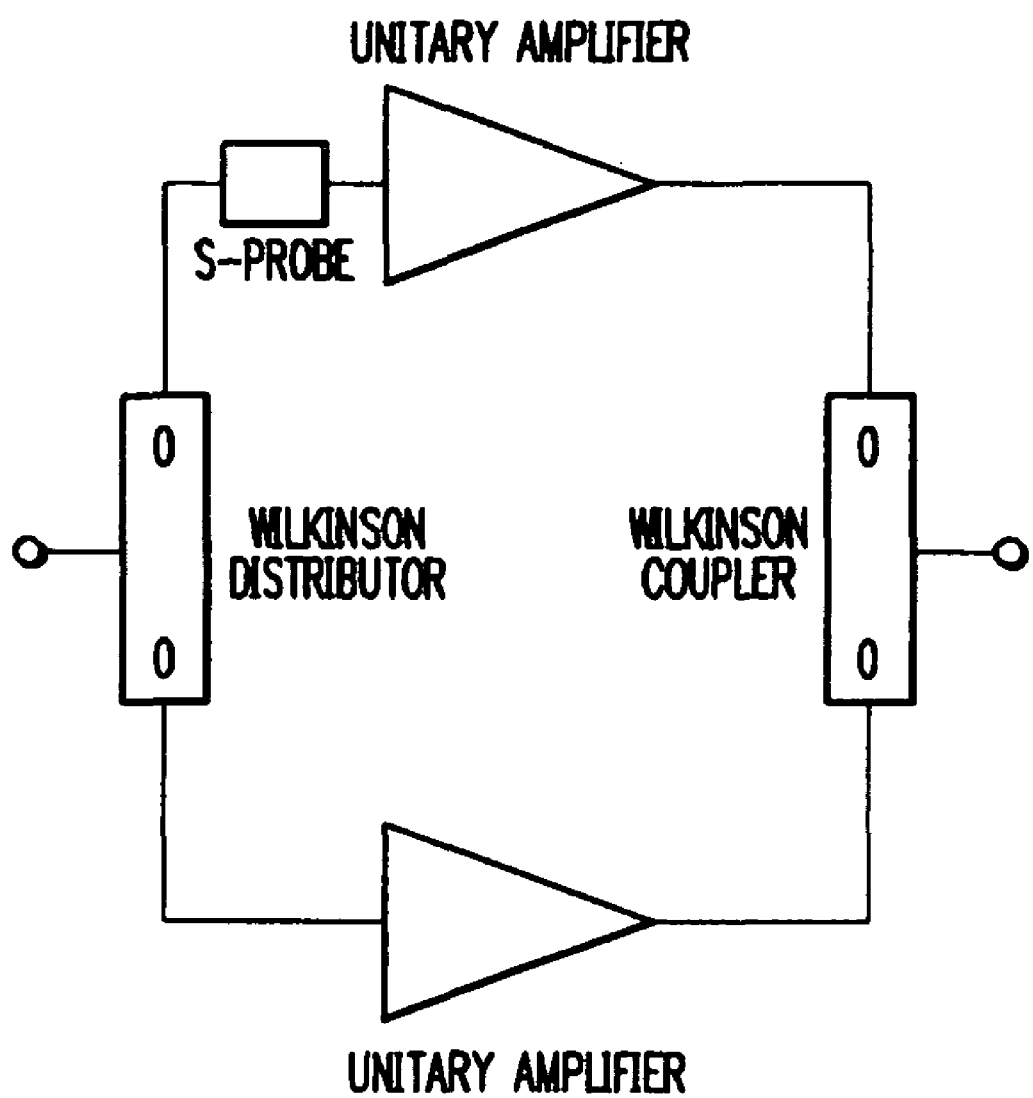
FIG. 27 is a diagram showing a parallel amplifier using a Wilkinson power distributing and coupling unit.
Figure 29:
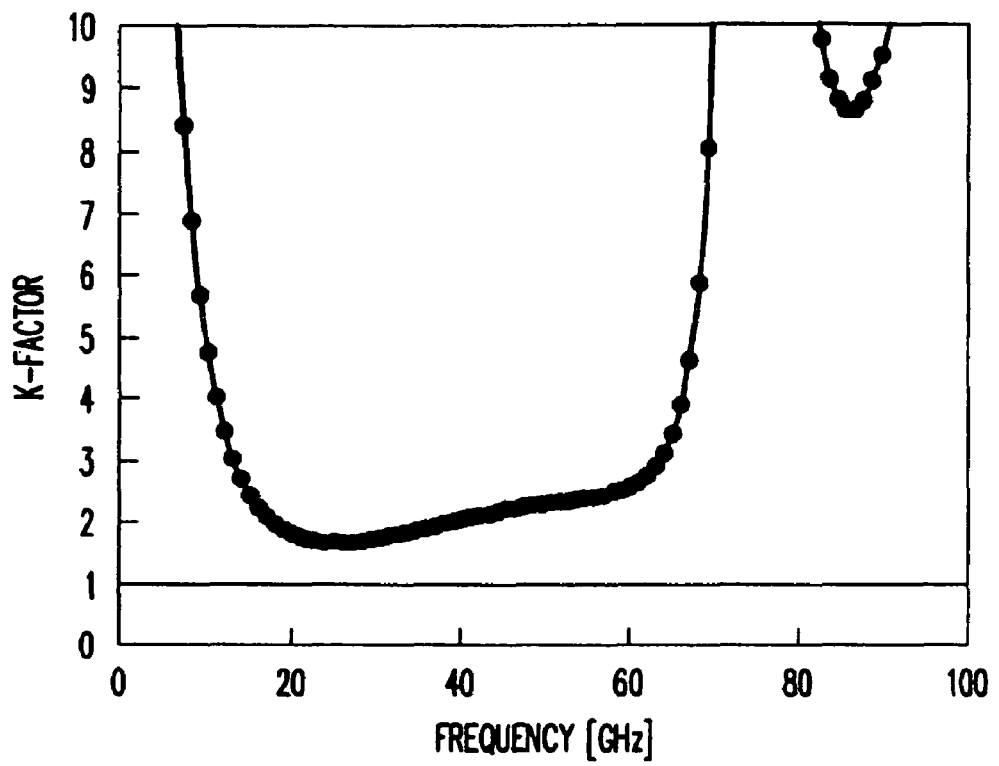
FIG. 29 is a diagram showing the stability factor K of the Wilkinson-type parallel amplifier.
Figure 30:
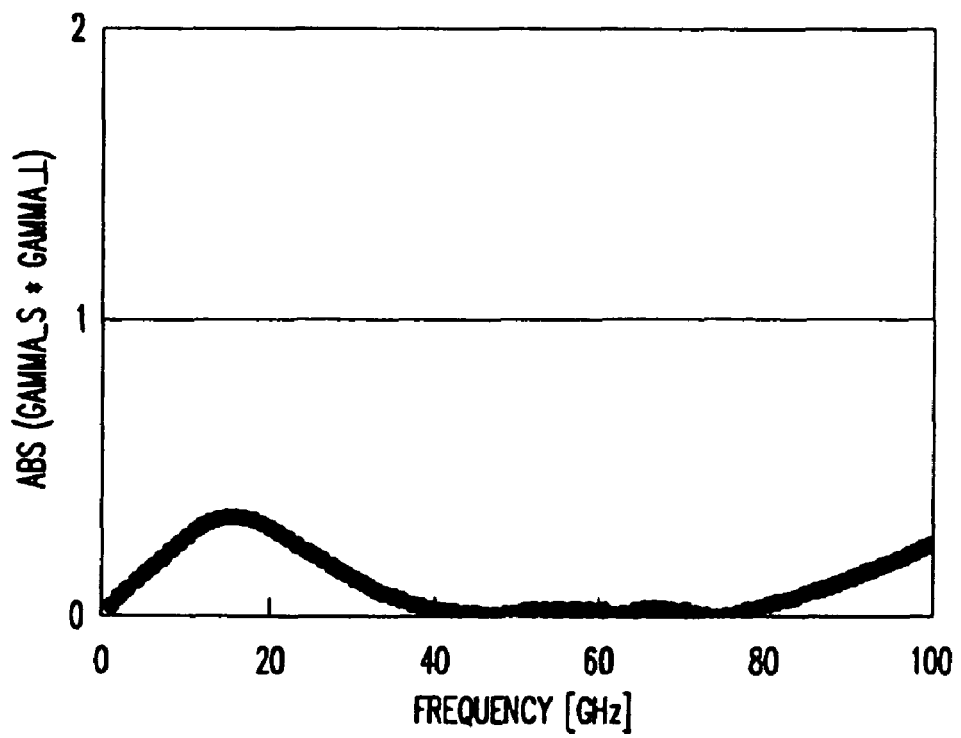
FIG. 30 is a diagram showing the odd-mode stability of the Wilkinson-type parallel amplifier.
Figure 31:
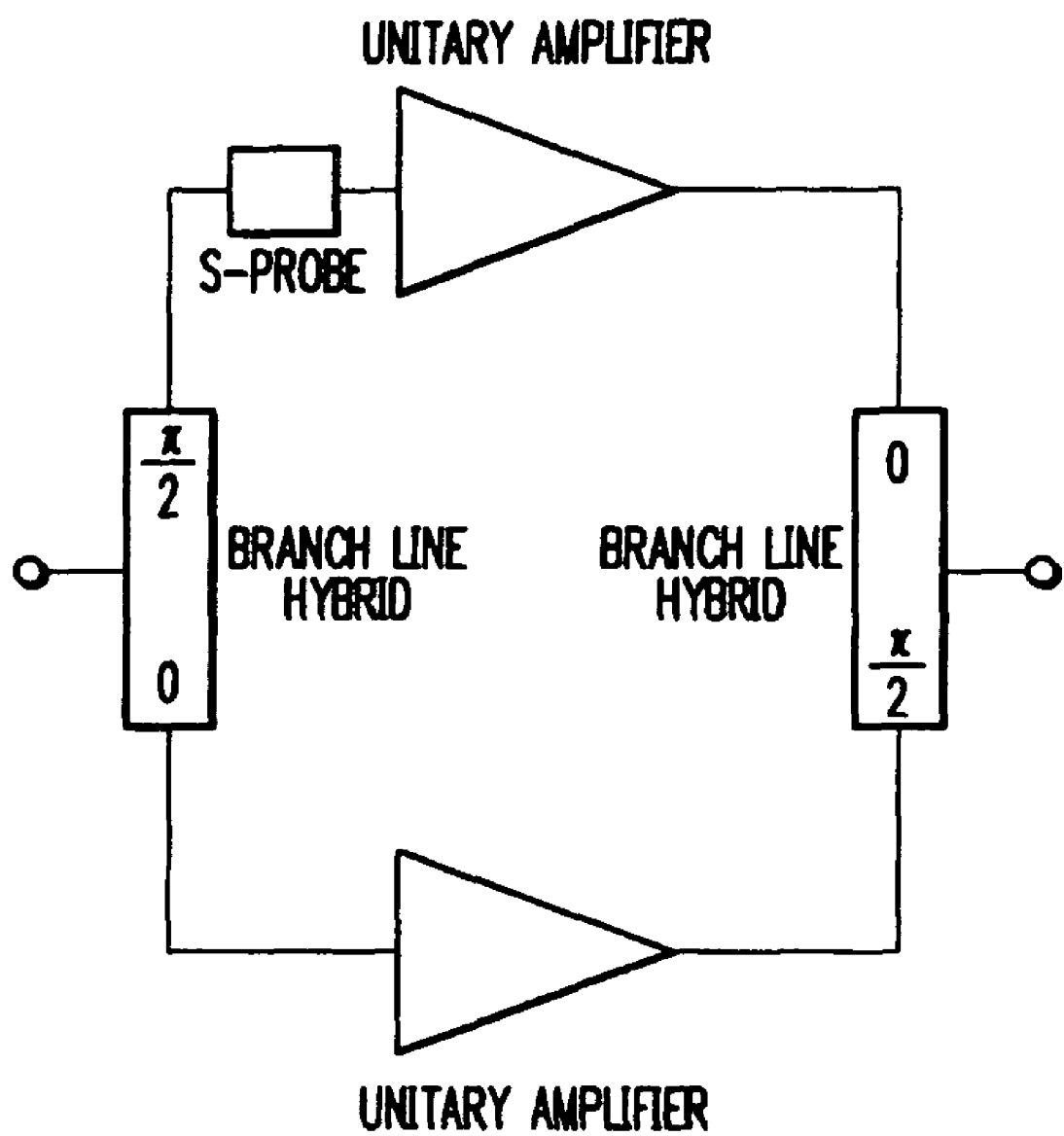
FIG. 31 is a diagram showing a balance-type amplifier using a 90-degree hybrid.
Figure 34:
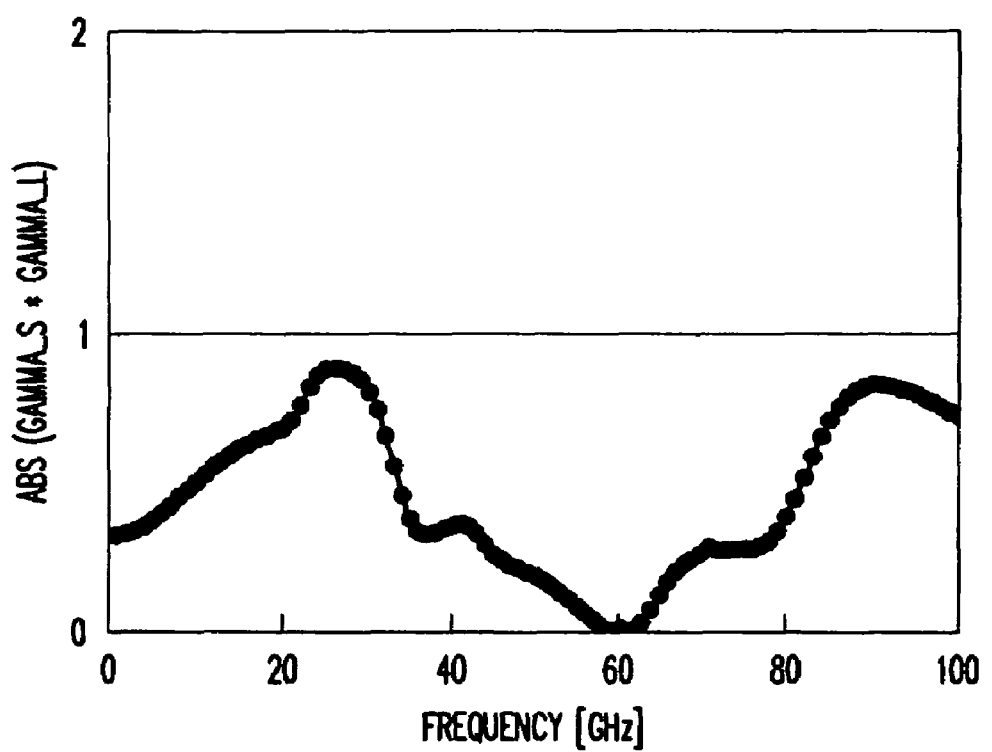
FIG. 34 is a diagram showing the odd-mode stability of the balance-type amplifier using a 90-degree hybrid.
Figure 35:
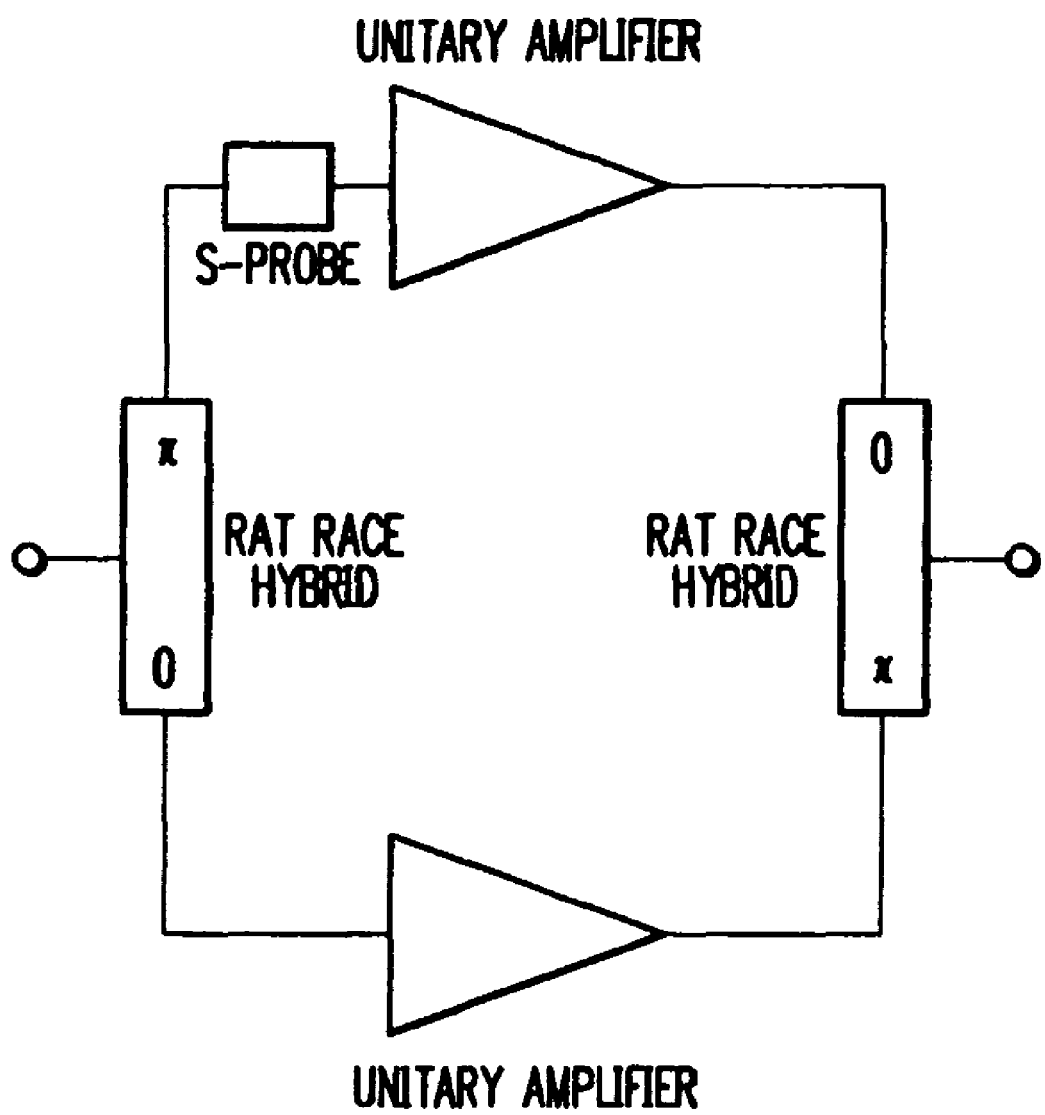
FIG. 35 is a diagram showing a push-pull amplifier using a 180-degree hybrid.
Figure 36:
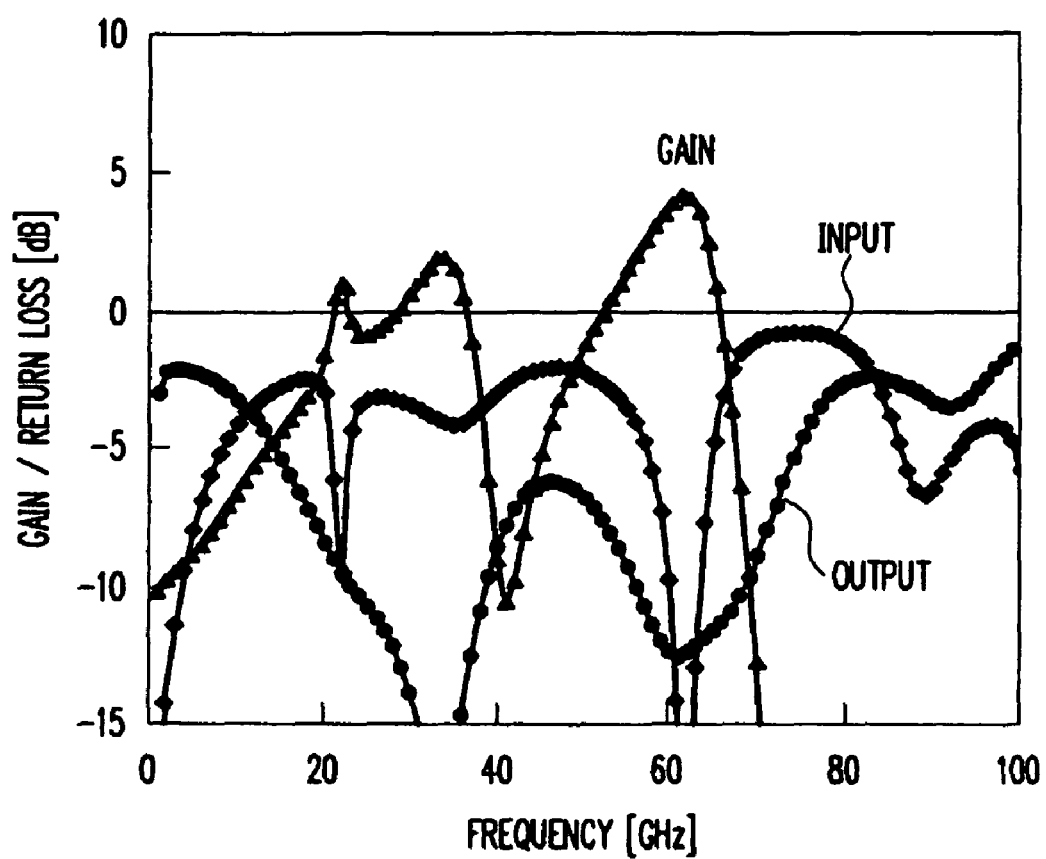
FIG. 36 is a diagram showing the small-signal characteristic of the push-pull amplifier using a 180-degree hybrid.
Figure 37:
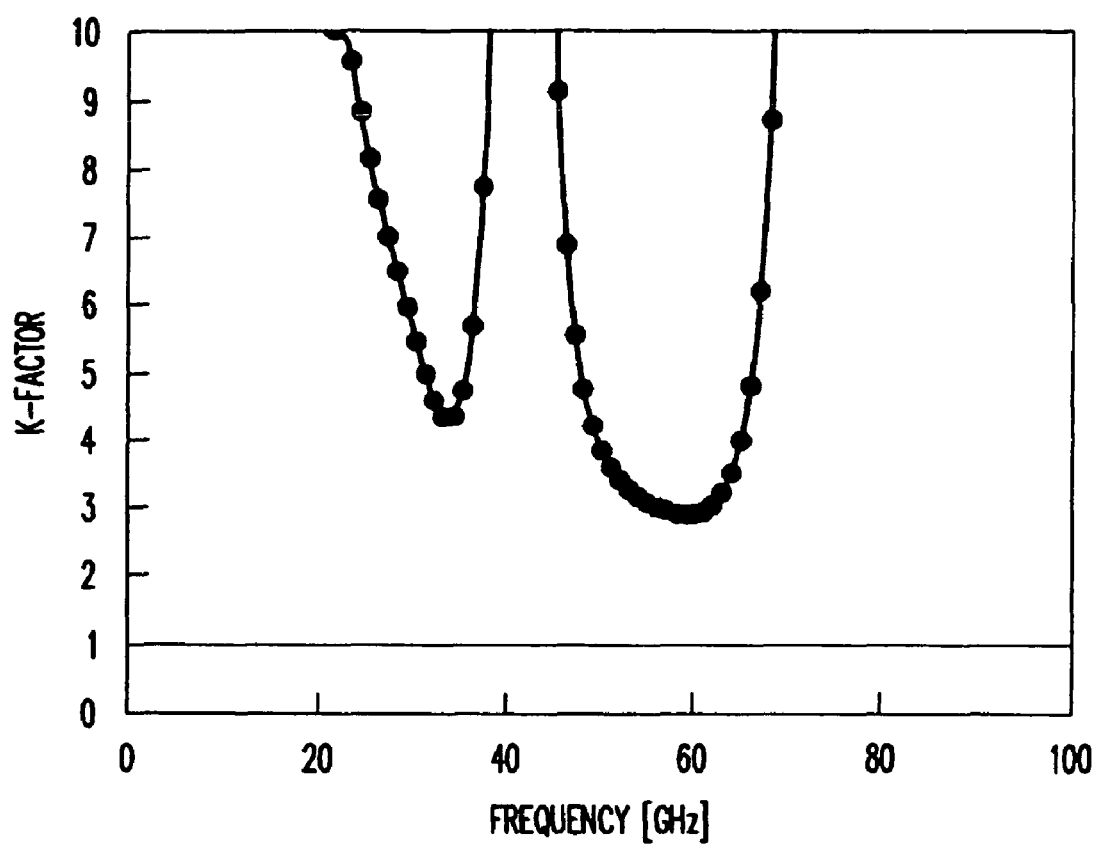
FIG. 37 is a diagram showing the stability factor K of the push-pull amplifier using a 180-degree hybrid.

The invention claimed is:

1. An RF circuit on a circuit simulator to be used in a microwave or millimeter wave range or a high-frequency range, comprising:

a function for being inserted by a first port and a second port thereof in a circuit to be observed, at an arbitrary cross-sectional point of the circuit, and evaluating a reflection coefficient or a characteristic impedance at the arbitrary cross-sectional point, wherein insertion loss caused by insertion of said function between the first port and the second port is zero or approximately zero and is ignorable also for any finite system impedance other than zero; and six RF ports, wherein:

a first resistor is connected from a first port to a node a on the circuit, a second resistor is connected from the node a to a node b, a third resistor is connected from the node b to a second port, a fourth resistor is connected from the node a to a node c, a fifth resistor is connected from the node b to a node d, and a sixth resistor is connected from the node b to a node e;

a first DC block is connected from the node c to a sixth port, a second DC block is connected from the node d to a fifth port, and a third DC block is connected from the node e to a ground point;

a first voltage-dependent owe source is connected from a third port to the ground point and a second voltage-dependent power source is connected from a fourth port to the ground point;

assuming that an instantaneous potential at the node a measure using as a reference the node b of the second resistor is Vr, there is induced, at a same time of occurrence of Vr, an instantaneous voltage of a magnitude of MVr, where M is a real coefficient, in a direction from the ground point to the third port;

assuming that an instantaneous potential at the node b measured using as a reference the node e of the sixth resistor is Vb, there is induced, at a same time of occurrence of Vb, voltage of a magnitude of Vb in a direction from the ground point to the fourth port;

assuming that Rx is a positive real number, Rs is a positive real number and Rs>1, and α is a real coefficient, the second resistor has a resistance value of Rx, the first and third resistors have resistance values which widely include also negative resistance and which are respectively −αRx and (α−1)Rx, a sum of them forms negative resistance −Rx and cancels out the second resistor Rx, such that an arithmetic sum of the sum and the second resistor Rx is zero;

and further each of the fourth, fifth, and sixth resistance values is a resistance value Rs more than system resistance.

2. The circuit in accordance with claim 1, wherein the first to sixth resistors are used at an environmental temperature set to absolute zero degree (zero degree Kelvin).

3. An evaluation method, wherein by inserting an RF circuit in accordance with claim 2 by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\delta_L$, an absolute value of a product therebetween abs($\Gamma_S\Gamma_L$) is or the absolute value of the product and a phase angle of the product phase($\Gamma_S\Gamma_L$) are employed as an index of stability of the circuit to be observed.

4. An algorithm on a circuit simulator, characterized in that by inserting an RF circuit in accordance with claim 2 by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\Gamma_L$, an absolute value of a product therebetween abs($\Gamma_S\Gamma_L$) the absolute value of the product and a phase angle of the product phase($\Gamma_S\Gamma_L$) is or are employed as an index of stability of the circuit to be observed.

5. A measuring method and a designing method for electric circuits such as an amplifier and an oscillator employing an RF circuit in accordance with claim 2 and a measuring method and a designing method for electric circuits such as an amplifier and an oscillator employing a method comprising by inserting the RF circuit by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\Gamma_L$, an absolute value of a product therebetween abs($\Gamma_S\Gamma_L$) is or the absolute value of the product and a phase angle of the product phase($\Gamma_S\Gamma_L$) are employed as an index of stability of the circuit to be observed.

6. A measuring apparatus and a designing apparatus for electric circuits such as an amplifier and an oscillator employing an RF circuit in accordance with claim 2 and a measuring apparatus and a designing apparatus for electric circuits such as an amplifier and an oscillator employing a method comprising by inserting the RF circuit by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection an absolute value of a product therebetween abs($\Gamma_S \Gamma_L$) is or the absolute value of the product and a phase angle of the product phase ($\Gamma_S \Gamma_L$) are employed as an index of stability of the circuit to be observed.

7. An evaluation method, characterized in that by inserting an RF circuit in accordance with claim 1 by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\delta_L$, an absolute value of a product therebetween abs($\Gamma_S \Gamma_L$) is or the absolute value of the product and a phase angle of the product phase($\Gamma_S \delta_L$)) are employed as an index of stability of the circuit to be observed.

8. An algorithm on a circuit simulator, wherein by inserting an RF circuit in accordance with claim 1 by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\Gamma_L$, an absolute value of a product therebetween abs($\Gamma_S \Gamma_L$) or the absolute value of the product and a phase angle of the product phase($\Gamma_S \Gamma_L$) is or are employed as an index of stability of the circuit to be observed.

9. A measuring method and a designing method for electric circuits such as an amplifier and an oscillator employing an RF circuit in accordance with claim 1 and a measuring method and a designing method for electric circuits such as an amplifier and an oscillator employing a method comprising by inserting the RF circuit by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\Gamma_L$, an absolute value of a product therebetween abs($\Gamma_S \Gamma_L$) is or the absolute value of the product and a phase angle of the product phase($\Gamma_S \Gamma_L$) are employed as an index of stability of the circuit to be observed.

10. A measuring apparatus and a designing apparatus for electric circuits such as an amplifier and an oscillator employing an RF circuit in accordance with claim 1 and a measuring apparatus and a designing apparatus for electric circuits such as an amplifier and an oscillator employing a method comprising by inserting the RF circuit by the first port and the second port in the circuit to be observed, at the arbitrary cross-sectional point of the circuit and evaluating a forward or backward reflection coefficient (or a characteristic impedance); and by assuming that the forward-view reflection coefficient is $\Gamma_S$ and the backward-view reflection coefficient is $\Gamma_L$, an absolute value of a product therebetween abs($\Gamma_S \Gamma_L$)) is or the absolute value of the product and a phase angle of the product phase($\Gamma_S \Gamma_L$) are employed as an index of stability of the circuit to be observed.

* * * * *